(12) United States Patent
Kuo et al.

(10) Patent No.: US 7,778,076 B2
(45) Date of Patent: *Aug. 17, 2010

(54) MEMORY UNIT

(75) Inventors: Ming-Chang Kuo, Hsinchu (TW); Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 195 days.

This patent is subject to a terminal disclaimer.

(21) Appl. No.: 11/767,980

(22) Filed: Jun. 25, 2007

(65) Prior Publication Data

US 2008/0316810 A1    Dec. 25, 2008

(51) Int. Cl.
*G11C 16/04* (2006.01)
(52) U.S. Cl. .............................. 365/185.07; 365/185.08
(58) Field of Classification Search ............ 365/185.07, 365/185.08
See application file for complete search history.

(56) References Cited

U.S. PATENT DOCUMENTS

| | | | | |
|---|---|---|---|---|
| 5,981,404 | A | * 11/1999 | Sheng et al. | ................. 438/791 |
| 6,363,011 | B1 | * 3/2002 | Hirose et al. | ........... 365/185.07 |
| 6,965,524 | B2 | 11/2005 | Choi | |
| 7,512,000 | B2 | * 3/2009 | Kuo | ...................... 365/185.08 |
| 2003/0113962 | A1 | * 6/2003 | Chindalore et al. | .......... 438/201 |

* cited by examiner

*Primary Examiner*—Hoai V Ho
*Assistant Examiner*—Jason Lappas
(74) *Attorney, Agent, or Firm*—J.C. Patents

(57) ABSTRACT

A memory unit is provided herein. Two non-volatile devices are used to store a logic state of the memory unit into the non-volatile devices. Although a power supply for the memory unit is shut down, the non-volatile devices still keep the data stored therein. The present invention not only has an advantage of high speed operation of a static random access memory (SRAM), but also has a function for storing data of a non-volatile memory.

24 Claims, 24 Drawing Sheets

MEMORY UNIT

BACKGROUND OF THE INVENTION

1. Field of the Invention

The present invention relates to a memory unit. More particularly, the present invention relates to a non-volatile memory unit.

2. Description of Related Art

Random access memory can be classified into dynamic random access memory (DRAM) and static random access memory (SRAM). SRAM is advantageous in high speed operation and low power consumption. Moreover, compared with DRAM, SRAM does not need to be re-charged periodically, and is simpler in design and fabrication. Thus, SRAM is widely employed in information electronic products.

SRAM is a volatile memory, which stores data according to the conductive state of transistors inside a memory cell. Therefore, when the power supply for the memory is shut down, the data stored in the SRAM will be lost completely.

In another aspect, electrically erasable programmable read only memory (EEPROM) has become a non-volatile memory element widely used in PCs and electronic equipments due to the advantages of storing, reading, erasing data repeatedly, and keeping the stored data even if the power shut down.

However, with the continuous progress of science and technology, IC technique is developing rapidly, and information electronic products are varied, such as computers, mobile phones, digital cameras, and personal digital assistants (PDAs). Accordingly, more data are required to be processed and stored by the information electronic products, and meanwhile the characteristics of light, thin, short, small, and portability of information electronic products must be taken into consideration. Therefore, in order to prevent data stored in an SRAM from getting lost when the power supply is shut down, it is required to provide a semiconductor device having the advantage of high speed operation of an SRAM and the function for storing data of a flash memory.

SUMMARY OF THE INVENTION

The present invention is directed to a memory unit. When a power supply for the memory unit is shut down, the stored logic state can still be kept. The present invention not only has an advantage of high speed operation, but also has a function for storing data of a non-volatile memory.

The present invention is directed to a memory unit. The data in the memory unit is stored in a non-volatile device, such that the data in the memory unit will not be lost when the power supply is shut down.

The present invention is directed to a memory unit, which includes a first metal oxide semiconductor (MOS) transistor, a second MOS transistor, a first non-volatile device, and a second non-volatile device. A first end of the first MOS transistor is coupled to the first contact, a second end of the first MOS transistor is coupled to a second voltage, and a gate of the first MOS transistor is coupled to the second contact. A first end of the second MOS transistor is coupled to the second contact, a second end of the second MOS transistor is coupled to a third voltage, and a gate of the second MOS transistor is coupled to the first contact. A control gate of the first non-volatile device is coupled to a first control bias, a first end is coupled to the first contact, and a second end is coupled to a first bit line. A control gate of the second non-volatile device is coupled to a second control bias, a first end is coupled to the second contact, and a second end is coupled to a second bit line.

In one embodiment of the present of the invention, the first non-volatile device and the second non-volatile device has a charge storage layer or a poly-split-gate structure. In another embodiment, an assistance charge is injected into the charge storage layer. In addition, the memory unit further has a first load unit and a second load unit. The first load unit is disposed between the first voltage and the first connector. The second load unit is disposed between the first voltage and the second connector.

According to an embodiment of the present invention, in the above memory unit, the first and second non-volatile devices respectively include a substrate, a charge storage layer, and a control gate. The substrate has a source region and a drain region. The charge storage layer is disposed on the substrate. A plurality of charges is stored on one side of the charge storage layer to accelerate the speed for programming another side of the charge storage layer 1. The control gate is disposed on the charge storage layer. In another embodiment, the charge storage layer comprises charge trapping material or conductive material. In other embodiment the first non-volatile device and the second non-volatile device has a top dielectric layer and a bottom dielectric layer. The top dielectric is disposed between the control gate and the charge storage layer. The bottom dielectric is disposed between the substrate and the charge storage layer. In one embodiment, the bottom dielectric layer is composed by a first oxide layer, a nitride layer, and a second oxide layer sequentially.

The first non-volatile device and second non-volatile device comprise a substrate, a floating gate, a control gate, and a gate dielectric layer. A source area and a drain area is disposed on the substrate. The floating gate is disposed on a portion area of the substrate. The control gate is also disposed on a portion area of the substrate and split with the floating gate. Wherein the area of the control gate is greater than the area of the floating gate. The gate dielectric is disposed between the control gate and the floating gate. In another embodiment, the gate dielectric is composed by a first oxide layer, a nitride layer, and a second oxide layer sequentially.

The present invention is directed to a memory unit, which includes a first non-volatile device, a second non-volatile device, a first MOS transistor, a second MOS transistor, a third MOS transistor, and a fourth MOS transistor. A first end of the first non-volatile device is coupled to a first voltage, a second end is coupled to a first contact, and a control gate is coupled to a first control bias. A first end of the second non-volatile device is coupled to the first voltage, a second end is coupled to a second contact, and a control gate is coupled to a second control bias. A first end of the first MOS transistor is coupled to the first contact, a second end is coupled to a second voltage, and a gate is coupled to the second contact. A first end of the second MOS transistor is coupled to the second contact, a second end is coupled to a third voltage, and a gate is coupled to the first contact. A gate of the third MOS transistor is coupled to a third control bias, a first end is coupled to the first contact, and a second end is coupled to a first bit line. A gate of the fourth MOS transistor is coupled to a fourth control bias, a first end is coupled to the second contact, and a second end is coupled to a second bit line.

The memory unit of the present invention utilizes two non-volatile devices, so as to store a logic state of the memory unit into the non-volatile devices. Even if a power supply for the memory unit is shut down, the non-volatile devices still keep the data stored therein. The present invention not only has an advantage of high speed operation of an SRAM, but also has a function for storing data of a non-volatile memory.

In order to make the aforementioned and other objects, features and advantages of the present invention comprehensible, preferred embodiment accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
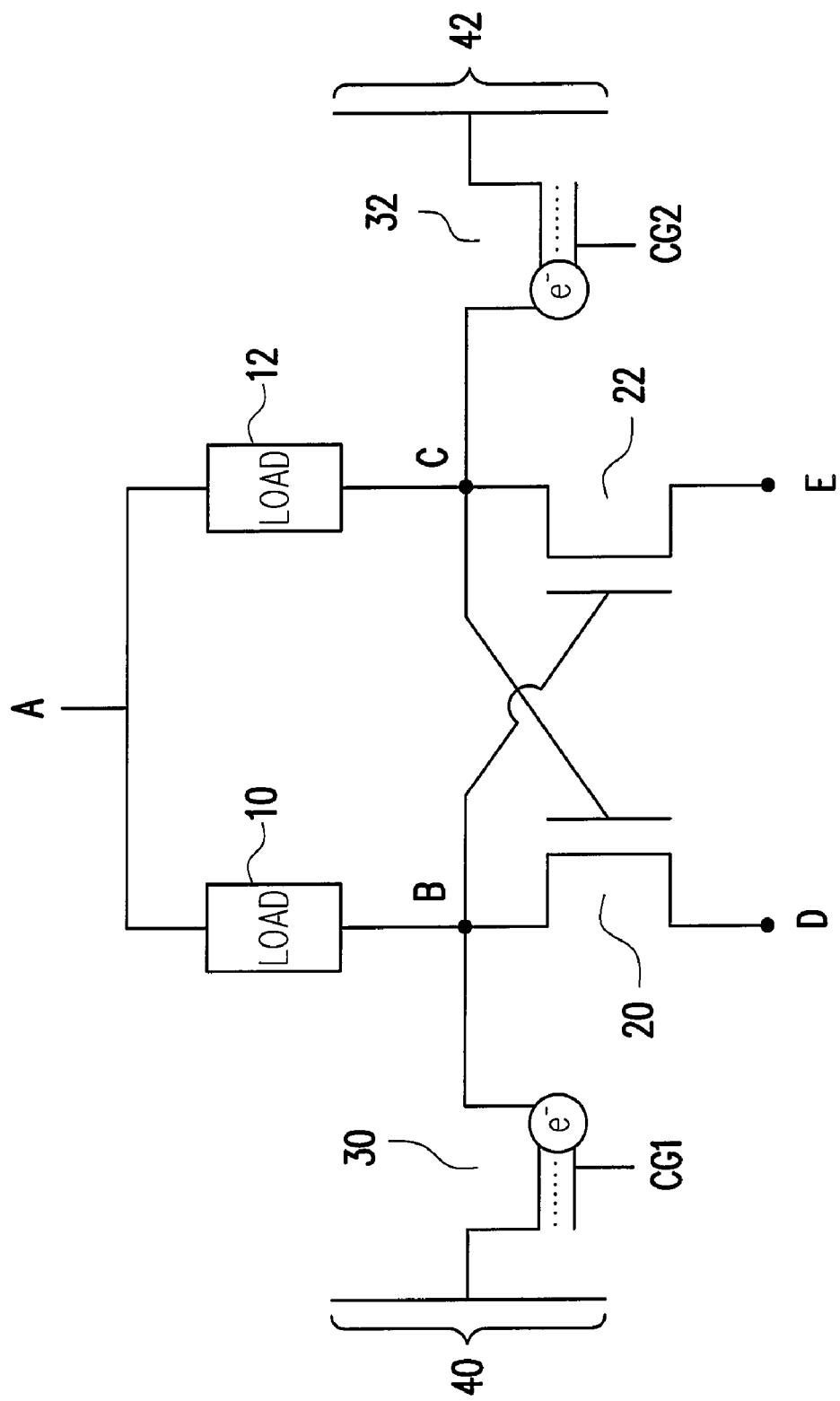
FIG. 1 is an equivalent circuit diagram of a memory unit according to a first embodiment of the present invention.

FIG. 1 is an equivalent circuit diagram of a memory unit according to a first embodiment of the present invention. The memory unit 100 includes load units 10, 12, MOS transistors 20, 22, and non-volatile devices 30, 32. A first end of the load unit 10 is coupled to an end point A, and a second end is coupled to an end point B, in which the end point A receives a first voltage. Further, a first end of the load unit 12 is coupled to the end point A, and a second end is coupled to an end point C. In this embodiment, the load units 10 and 12 can be resistors, but the present invention is not limited to this. In another optional embodiment, the load units 10 and 12 can also be depletion mode transistors, PMOS transistors, TFTs, and so on.

Referring to FIG. 1, a first end of the MOS transistor 20 is coupled to the end point B, a second end is coupled to an end point D, and a gate is coupled to the end point C. A first end of the MOS transistor 22 is coupled to the end point C, a second end is coupled to an end point E, and a gate is coupled to the end point B. In this embodiment, the MOS transistors 20 and 22 are, for example, NMOS transistors.

Further, in this embodiment, a control gate of the non-volatile device 30 is coupled to an end point CG1, a first end is coupled to the end point B, and a second end is coupled to a bit line 40. A control gate of the non-volatile device 32 is coupled to an end point CG2, a first end is coupled to the end point C, and a second end is coupled to a bit line 42. The non-volatile devices 30 and 32 respectively have a charge storage layer. When the memory unit is in operation, an assist charge is injected into the charge storage layer. In a preferred embodiment, the non-volatile devices 30 and 32 respectively have an AC-SONOS structure.

Figure 2A:
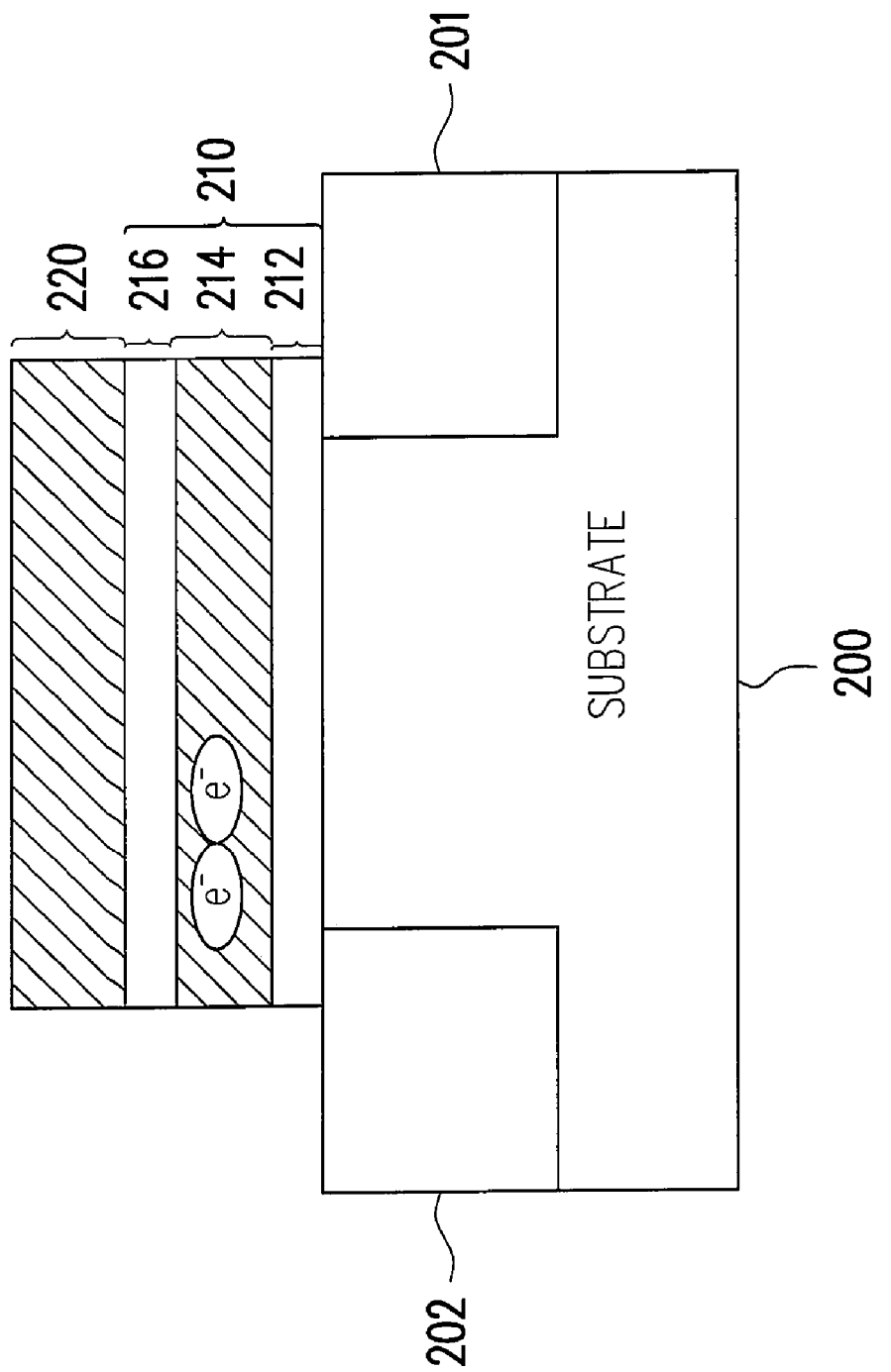
FIG. 2A is a structural cross-sectional view of a non-volatile device according to a first embodiment of the present invention.

FIG. 2A is a structural cross-sectional view of a non-volatile device according to a first embodiment of the present invention. Referring to FIG. 2A, the structural cross-sectional views of the non-volatile devices 30, 32 are substantially the same, so only the non-volatile device 30 is taken as an example for illustration herein. The non-volatile device 30, for example, includes a substrate 200, a bottom dielectric layer 212, a charge storage layer 214, a top dielectric layer 216, and a control gate 220.

The substrate 200 (for example, a P-type substrate) has a source region 202 and a drain region 204. The charge storage layer 214 is disposed on the substrate 200. The bottom dielectric layer 212 is disposed between the substrate 200 and the charge storage layer 214. A plurality of charges is stored on a first side of the charge storage layer 214 to accelerate the speed for programming another side of the charge storage layer. The control gate 220 is disposed on the charge storage layer 214 the top dielectric layer 216 is disposed between the charge storage layer 214 and the control gate 220.

The material of the control gate 220 is, for example, doped poly-silicon or other suitable conductive materials. The material of the charge storage layer 214, for example, comprises a charge trapping material or a conductive material. Wherein, the charge trapping material is such as Silicon nitride, and the conductive material comprises poly-silicon. In addition, the material of the top dielectric layers 212 and the bottom dielectric layer 216 are, for example, silicon oxide (SiO or $SiO_2$). As the charge storage layer 214 is used for storing charges, the non-volatile devices 30 and 32 can store data of the memory unit 100, such that the data may not get lost when the power supply is shut down.

It is worth to mention that, in another embodiment, the structure of the bottom dielectric layer 212 is able to a bandgap engineered tunnel structure. For example, the bottom dielectric layer 212 composed by a first oxide layer, a nitride layer, and a second oxide layer sequentially. Wherein, for example, the material of oxide layer comprises silicon oxide, and the nitride layer comprises silicon nitride. The dimension of the oxide layer near the substrate 200 is, for example, less than 20 nm, between 5 nm and 20 nm, less than 15 nm, between 10 nm and 20 nm, or between 10 nm and 15 nm. In addition, the dimension of the nitride layer is, for example, less than 20 nm or between 10 nm and 20 nm. The dimension of the oxide layer near the charge storage layer 214 is, for example, less than 20 nm, between 15 nm and 20 nm, or between 10 nm and 20 nm. Next, the operating process of the memory unit 100 will be illustrated in detail below.

Figure 2B:
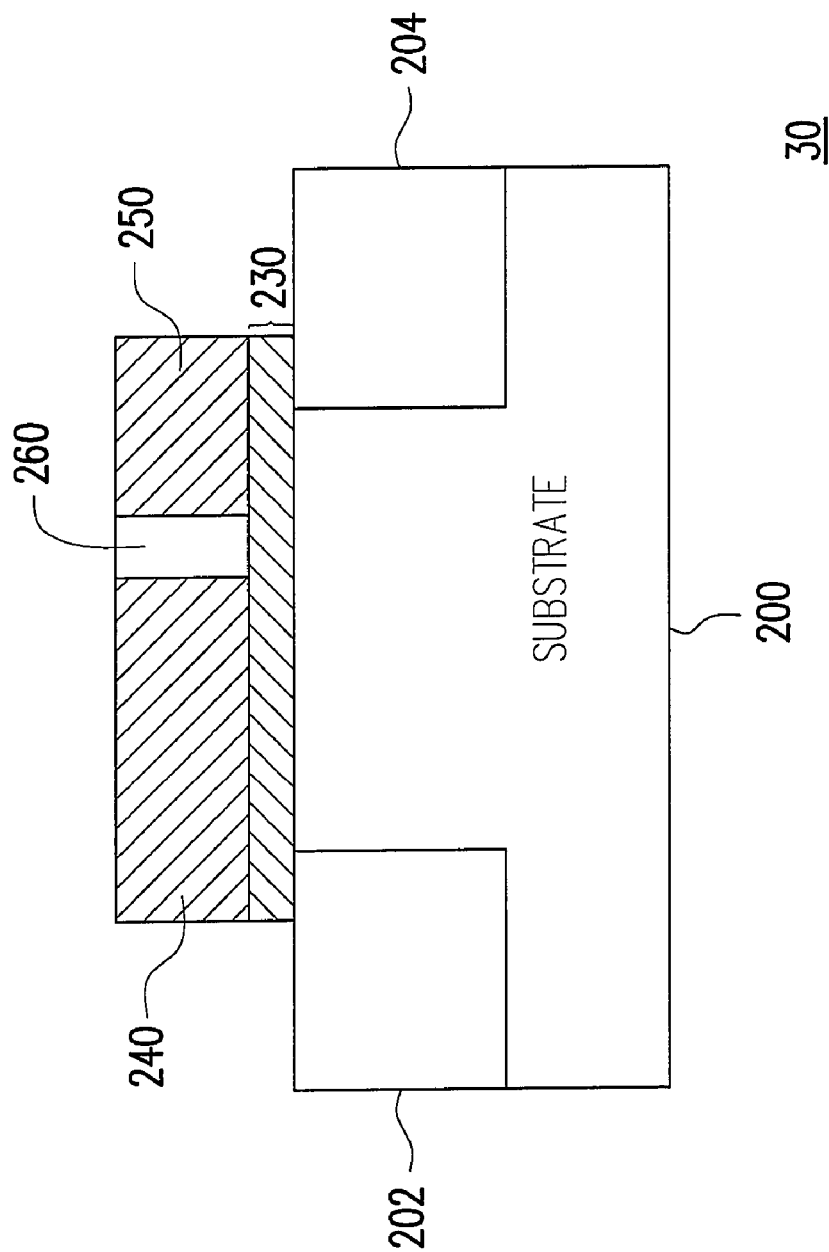
FIG. 2B is another structural cross-sectional view of a non-volatile device according to a first embodiment of the present invention.

Although a possible structure of the non-volatile device 30 and 32 are described in above description, the present invention is not limited. For example, the non-volatile device 30 and 32 also have a poly-split-gate structure. FIG. 2B is another structural cross-sectional view of a non-volatile device according to a first embodiment of the present invention. Referring to FIG. 2B, the structures of the non-volatile devices 30 and 32 is the same substantially. For example, the non-volatile device 30 comprises a substrate 200, a control gate 240, a floating gate 250, an oxide layer 260 and a gate dielectric layer 230.

There are a source area 202 and a drain area 204 in the substrate 200, for example, being a P-type substrate. The floating gate 250 is disposed on a portion area of the substrate 200. The control gate 240 is also disposed on a portion area of the substrate 200, and split with the floating gate 250. Wherein, the area of the control gate 240 is greater than the area of the floating gate 250. The oxide layer 260 is disposed between the floating gate 250 and the control gate 240. The gate dielectric layer 230 is disposed between the substrate 200 and the floating gate 250 and the control gate 240.

Wherein, the material of the control gate 260 is a material doped poly-silicon or others suitable conductive material. The material of the floating gate 250, for example, is a conductive doped poly-silicon, silicon nitride, or others suitable conductive material. Due to the control gate 240 is utilized for storing charge, the data of the memory unit 30 is able to store in the control gate 260 to prevent the data disappeared because of power off.

It is worth to mention that, in another embodiment, the structure of the gate dielectric layer 230 is capable of a bandgap engineered tunnel structure. For example, the gate dielectric layer 230 is constituted by a first oxide layer, a nitride layer, and a second oxide layer sequentially. Wherein, for example, the material of oxide layer comprises silicon oxide, and the nitride layer comprises silicon nitride. The dimension of the oxide layer near the substrate 200 is, for example, less than 20 nm, between 5 nm and 20 nm, less than 15 nm, between 10 nm and 20 nm, or between 10 nm and 15 nm. In addition, the dimension of the nitride layer is, for example, less than 20 nm or between 10 nm and 20 nm. The dimension of the oxide layer near the floating gate 250 is, for example, less than 20 nm, between 15 nm and 20 nm, or between 10 nm and 20 nm. Next, the operating process of the memory unit 100 will be illustrated in detail below.

In this embodiment, the following description is given on the conditions of the non-volatile device 30 and 32 of the memory unit 100 with charge storage structure. It is assumed that when the end point B of the memory unit 100 is at a logic high level and the end point C is at a logic low level, the data stored in the memory unit 100 is of Logic 1. On the contrary, when the end point B of the memory unit 100 is at a logic low level and the end point C is at a logic high level, the data stored in the memory unit 100 is of Logic 0.

Figure 3A:
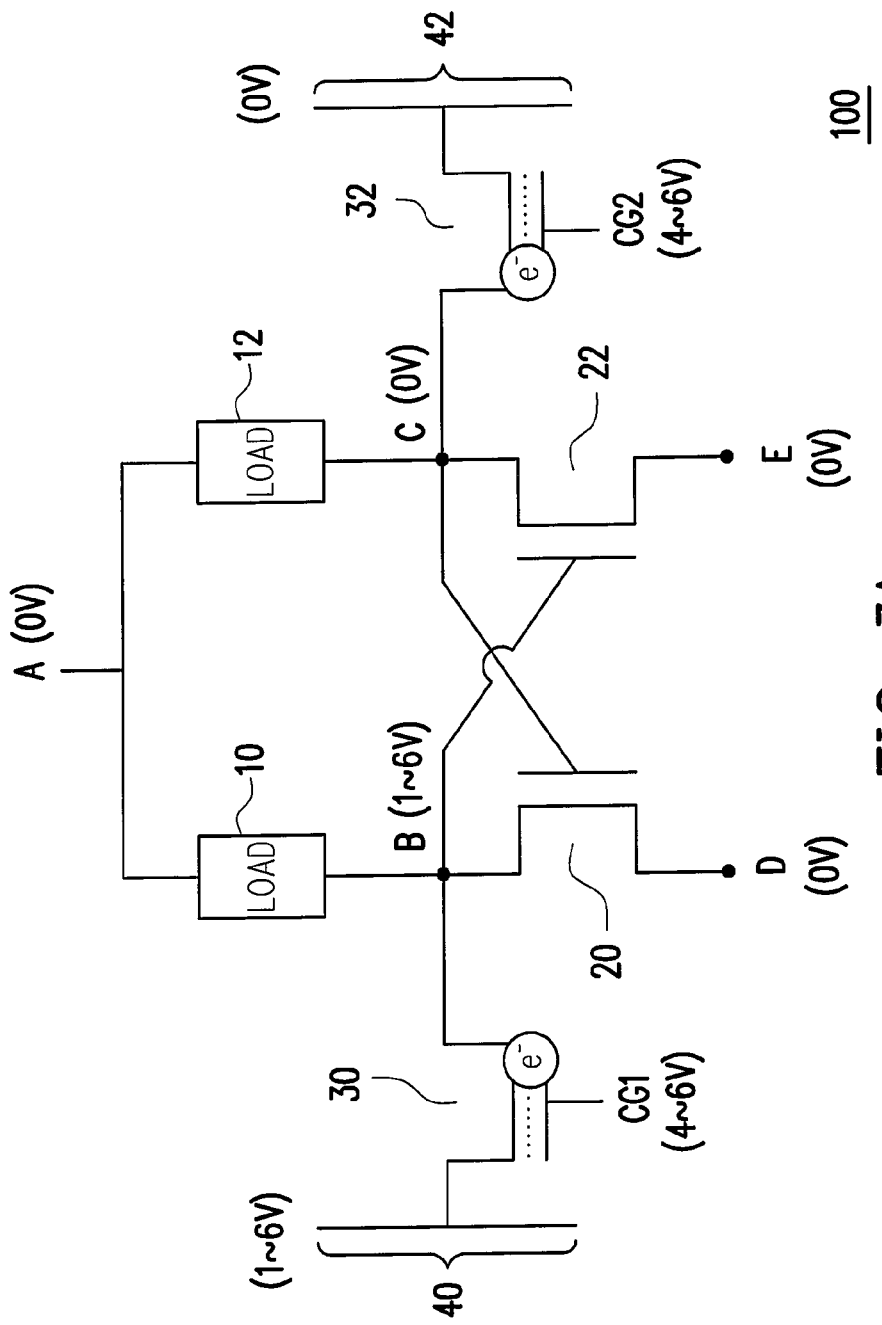
FIG. 3A is a schematic circuit diagram of a memory unit when the data of Logic 1 is programmed in according to a first embodiment of the present invention.

FIG. 3A is a schematic circuit diagram of a memory unit when the data of Logic 1 is programmed in according to a first embodiment of the present invention. Referring to FIG. 3A, it is assumed that the data of Logic 1 is to be programmed into the memory unit 100. First, a voltage signal at a logic high level, for example, between 1-6 V, is provided to the bit line 40. Meanwhile, a voltage signal at a logic low level, for example, 0 V, is provided to the end points A, D, E, and the bit line 42. Further, a control bias at a level, for example, between 4-6 V, is provided to the end points CG1 and CG2. Thus, the non-volatile devices 30 and 32 are in an ON state. As such, the logic high level of the bit line 40 is stored in the end point B, and the logic low level of the bit line 42 is stored in the end point C.

Figure 3B:
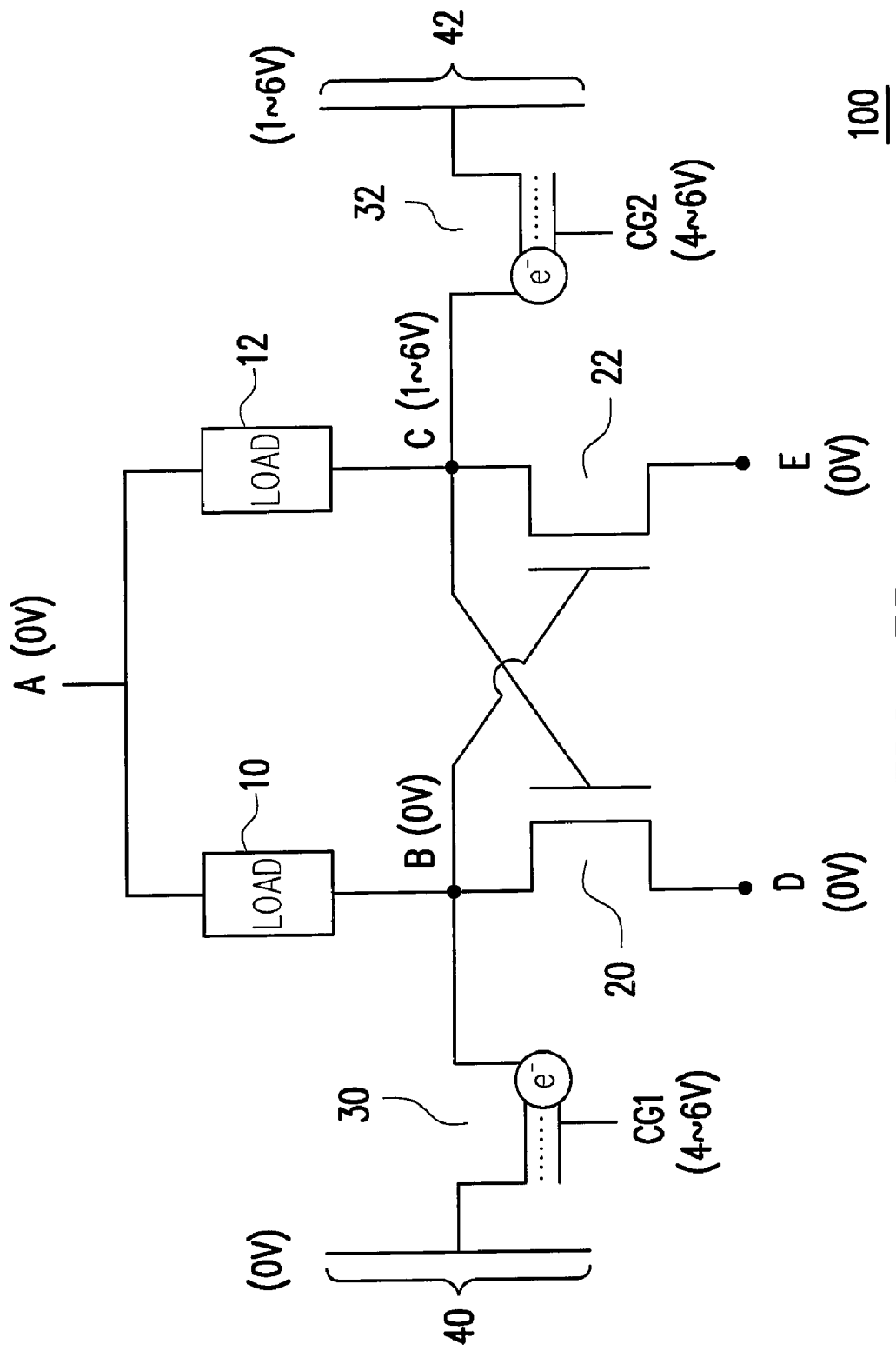
FIG. 3B is a schematic circuit diagram of a memory unit when the data of Logic 0 is programmed in according to a first embodiment of the present invention.

FIG. 3B is a schematic circuit diagram of a memory unit when the data of Logic 0 is programmed in according to a first embodiment of the present invention. Referring to FIG. 3B, it is assumed that the data of Logic 0 is to be programmed into the memory unit 100. First, a voltage signal at a logic high level, for example, between 1-6 V, is provided to the bit line 42. Meanwhile, a voltage signal at a logic low level, for example, 0 V, is provided to the end points A, D, E, and the bit line 40. Further, a control bias at a level, for example, between 4-6 V, is provided to the end points CG1 and CG2. Thus, the non-volatile devices 30 and 32 are in an ON state. As such, the logic low level of the bit line 40 is stored in the end point B, and the logic high level of the bit line 42 is stored in the end point C. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 5 and 8 volt.

Figure 4:
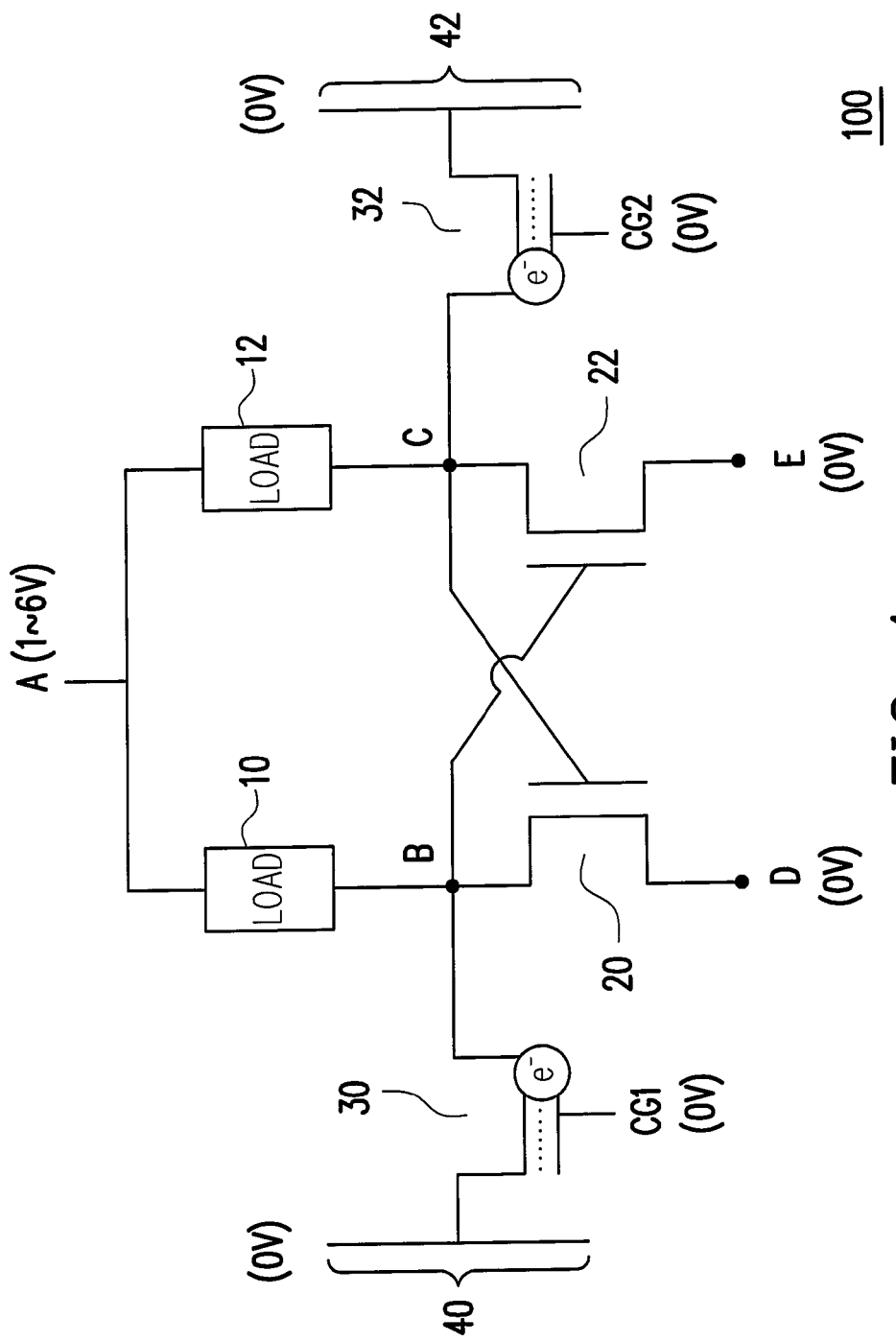
FIG. 4 is a schematic circuit diagram of a memory unit in a maintain state according to a first embodiment of the present invention.

FIG. 4 is a schematic circuit diagram of a memory unit in a maintain state according to a first embodiment of the present invention. Referring to FIG. 4, it is assumed that the data of the memory unit 100 is to be in a maintain state. First, a voltage signal at a logic high level, for example, between 1-6 V, is provided to the end point A. Meanwhile, a voltage signal at a logic low level, for example, 0 V, is provided to the end points D, E, and the bit lines 40, 42. Further, a voltage signal at a logic low level, for example, 0 V, is provided to the end points CG1 and CG2. Thus, the non-volatile devices 30 and 32 are in an open state. As such, the logic level of the end points B and C is in a maintain state. In other words, the data stored in the memory unit 100 can maintain the original logic state.

Figure 5A:
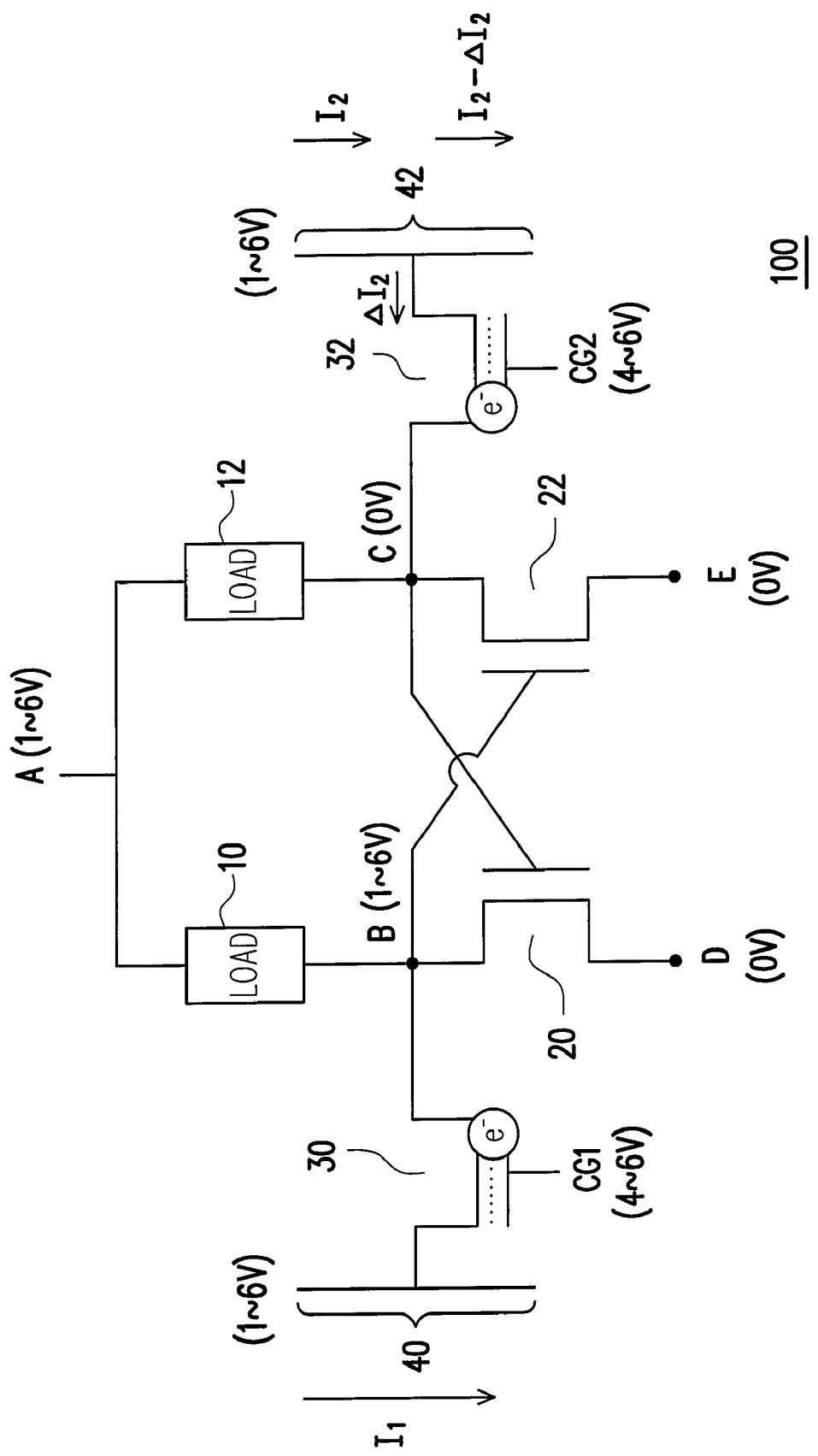
FIG. 5A is a schematic circuit diagram when the data of Logic 1 stored in a memory unit is read according to a first embodiment of the present invention.

FIG. 5A is a schematic circuit diagram when the data of Logic 1 stored in a memory unit is read according to a first embodiment of the present invention. Referring to FIG. 5A, it is assumed that the data of Logic 1 is written into the memory unit 100. First, a voltage signal at a logic high level, for example, between 1-6 V, is provided to the end point A, a first end of the bit line 40, and a first end of the bit line 42. Meanwhile, a voltage signal at a logic low level, for example, 0 V, is provided to the end points D and E. Further, a control bias at a level, for example, between 4-6 V, is provided to the end points CG1 and CG2. Thus, the non-volatile devices 30 and 32 are in an ON state.

As such, though the non-volatile device 30 is in the ON state, as the end point B and the bit line 40 are at the same level, it can be regarded as that no current passes through the non-volatile device 30. That is, if the first end of the bit line 40 provides a current I1, a second end of the bit line 40 will receive the current I1. In another aspect, the end point C is at a level lower than that of the bit line 42. Thus, if the first end of the bit line 42 provides a current I2, a part of the current ΔI2 will flow from the bit line 42 and sequentially pass through the non-volatile device 32, the end point C, the MOS transistor 22 and then to the end point E. Besides, a second end of the bit line 42 will receive the current I2-ΔI2.

Those of ordinary skill in the art can use a sense amplifier of the memory unit 100 (not shown) to sense the difference of the output current amount between the second end of the bit line 40 and the second end of the bit line 42, the logic state of the data stored in the memory unit 100 can be read. For example, the output current amount of the second end of the bit line 40 is larger than that of the second end of the bit line 42, which indicates that the logic state of the data stored in the memory unit 100 is Logic 1. Oppositely, the output current amount of the second end of the bit line 40 is smaller than that of the second end of the bit line 42, which indicates that the logic state of the data stored in the memory unit 100 is Logic 0.

Figure 5B:
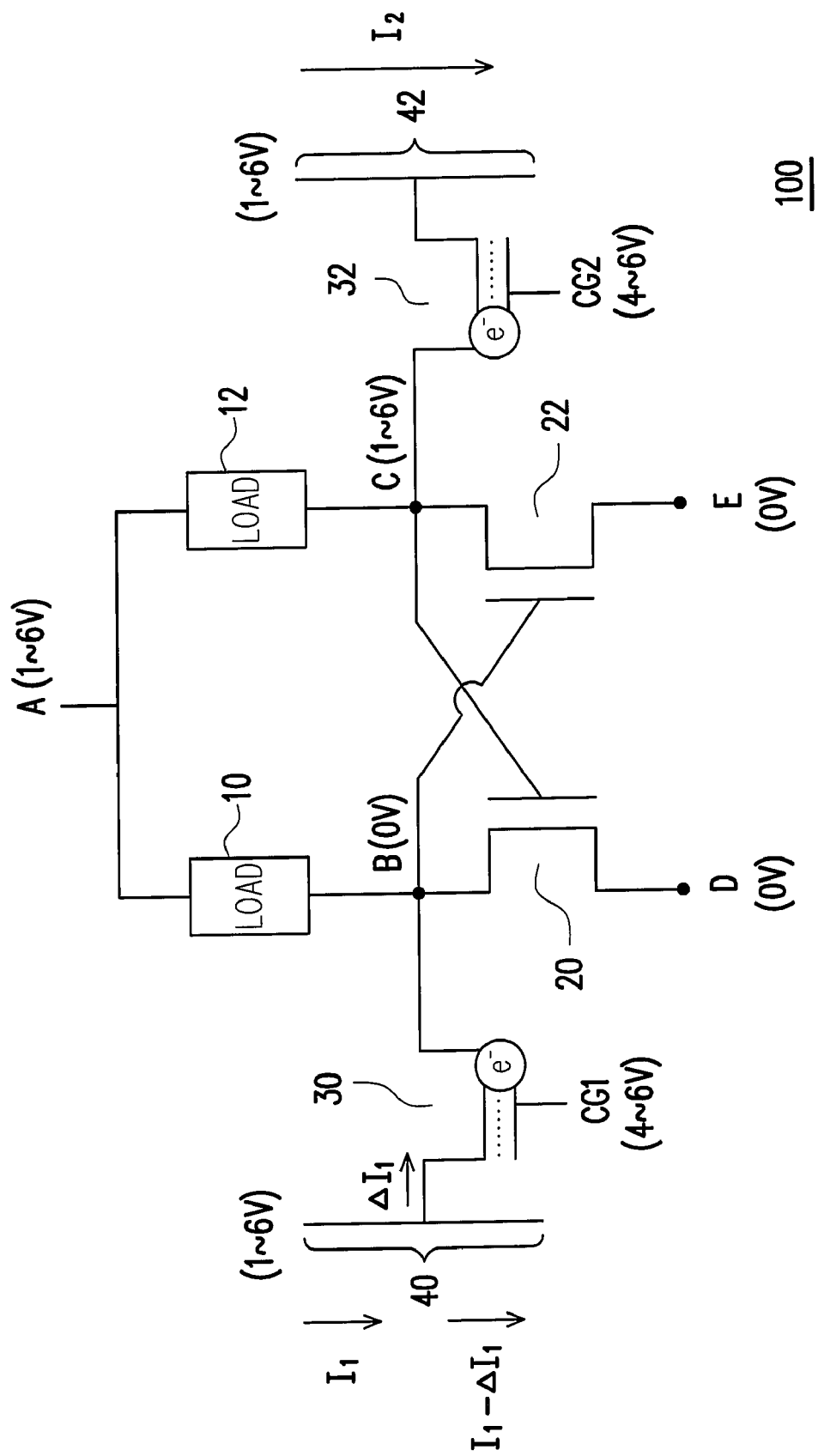
FIG. 5B is a schematic circuit diagram when the data of Logic 0 stored in a memory unit is read according to a first embodiment of the present invention.

FIG. 5B is a schematic circuit diagram when the data of Logic 0 stored in a memory unit is read according to a first embodiment of the present invention. Referring to FIG. 5B, it is assumed that the data of Logic 0 is stored in the memory unit 100. First, a voltage signal at a logic high level, for example, between 1-6 V, is provided to the end point A, the first end of the bit line 40, and the first end of the bit line 42. Meanwhile, a voltage signal at a logic low level, for example, 0 V, is provided to the end points D and E. Further, a control bias at a level, for example, between 4-6 V, is provided to the end points CG1 and CG2. Thus, the non-volatile devices 30 and 32 are in the ON state. Other reading principles can refer to the illustration of FIG. 5A, and the details will not be repeated herein again. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 5 and 8 volt.

Figure 6A:
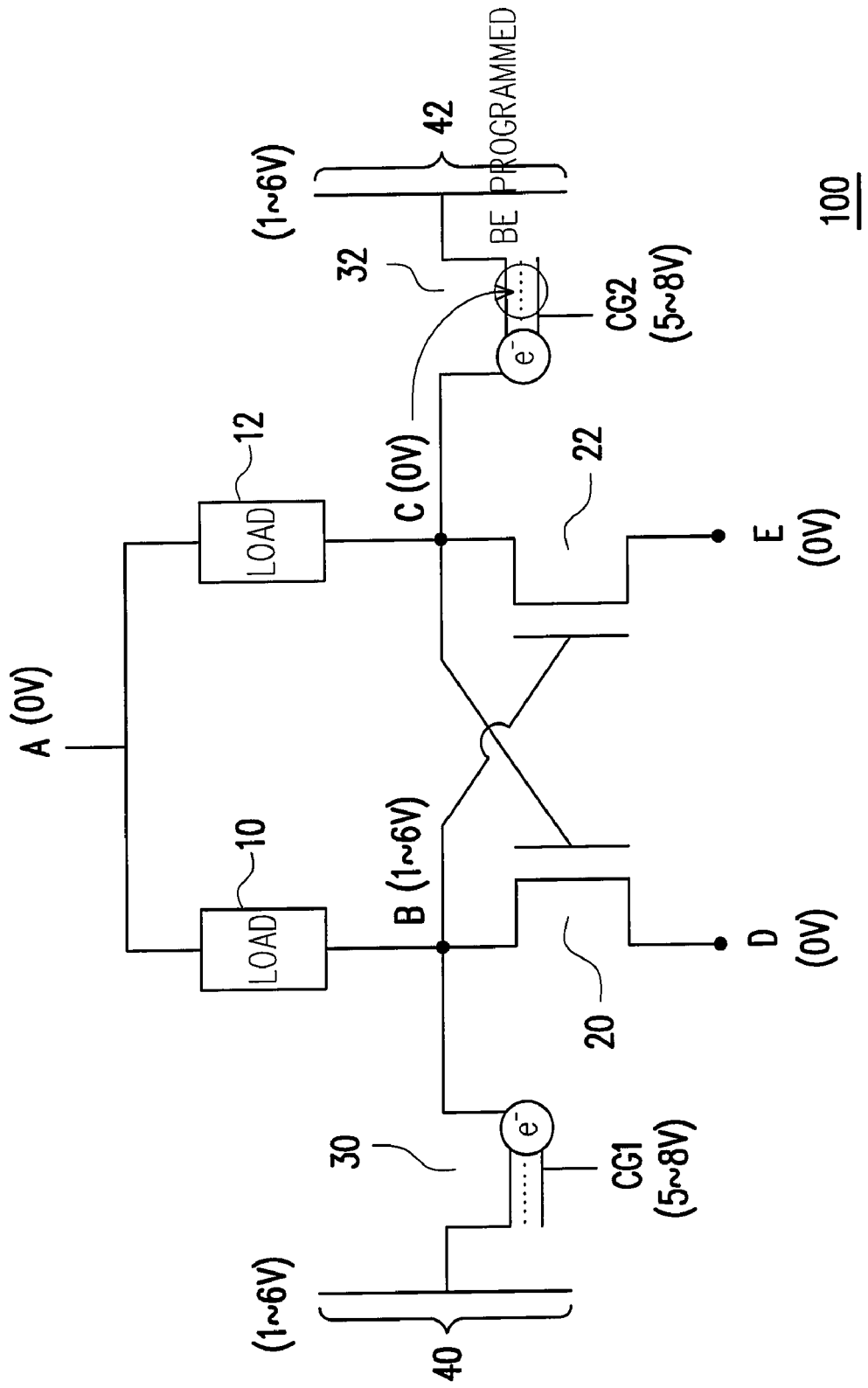
FIG. 6A is a schematic circuit diagram when the data of Logic 1 stored in a memory unit is written into a non-volatile device according to a first embodiment of the present invention.

FIG. 6A is a schematic circuit diagram when the data of Logic 1 stored in a memory unit is written into a non-volatile device according to a first embodiment of the present invention. Referring to FIGS. 6A and 2 together, it is assumed that the data of Logic 1 is stored in the memory unit 100. First, a voltage signal at a logic high level, for example, between 1-6 V, is provided to the end point A and the bit lines 40, 42. Meanwhile, a voltage signal at a logic low level, for example, 0 V, is provided to the end points D and E. Further, a control bias at a level, for example, between 5-8 V, is provided to the end points CG1 and CG2. As the end points C and the bit line 42 have a certain voltage difference, a charge may be injected from the end point C into the charge storage layer 214 of the non-volatile device 32, i.e., the non-volatile device 32 is programmed. The voltage difference between the end points B and CG1 is insufficient to have the non-volatile device 30 programmed.

It should be noted that a plurality of charges is stored on the first side of the charge storage layer 214 to accelerate the speed for programming another side of the charge storage layer. Thus, during the programming of the non-volatile device 32, a second side of the charge storage layer 214 is programmed. As such, the logic state (Logic 1) of the data stored in the memory unit 100 is stored into the non-volatile device 32. In other words, even if the power supply is shut down, the non-volatile device 32 still maintains a programmed state.

Figure 6B:
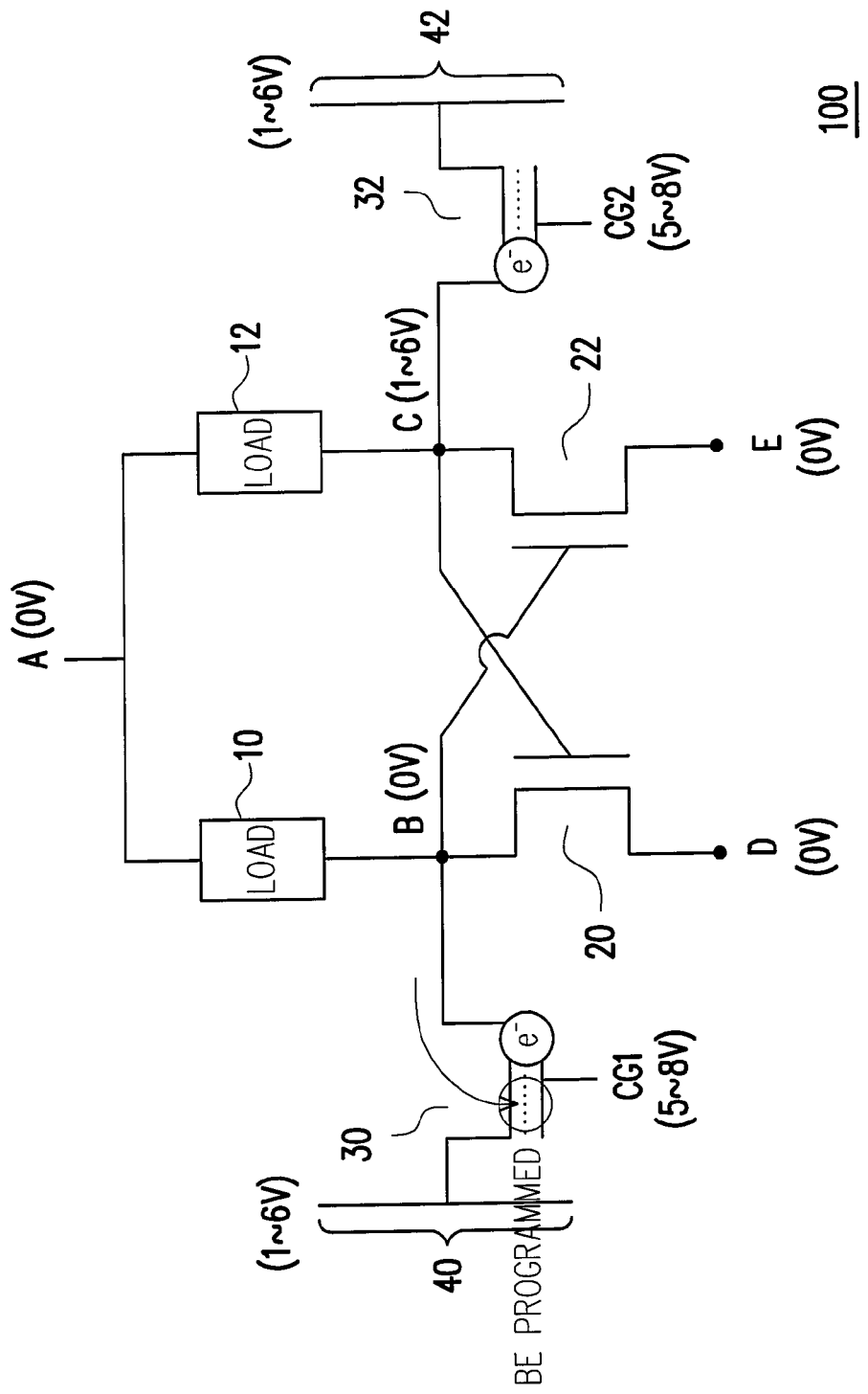
FIG. 6B is a schematic circuit diagram when the data of Logic 0 stored in a memory unit is written into a non-volatile device according to a first embodiment of the present invention.

FIG. 6B is a schematic circuit diagram when the data of Logic 0 stored in a memory unit is written into a non-volatile device according to a first embodiment of the present invention. Referring to FIGS. 6B and 2 together, it is assumed that the data of Logic 0 is stored in the memory unit 100. First, a voltage signal at a logic high level, for example, between 1-6 V, is provided to the end point A and the bit lines 40, 42. Meanwhile, a voltage signal at a logic low level, for example, 0 V, is provided to the end points D and E. Further, a control bias at a level, for example, between 5-8 V, is provided to the end points CG1 and CG2. As the end points B and the bit line 40 have a certain voltage difference, a charge may be injected from the end point B into the charge storage layer 214 of the non-volatile device 30, i.e., the non-volatile device 30 is programmed. The voltage difference between the end points C and the bit line 42 is insufficient to have the non-volatile device 32 programmed.

It should be noted that a plurality of charges is stored on the first side of the charge storage layer 214 to accelerate the speed for programming another side of the charge storage layer. Thus, during the programming of the non-volatile device 30, the second side of the charge storage layer 214 is programmed. As such, the logic state (Logic 0) of the data stored in the memory unit 100 is stored into the non-volatile device 30. In other words, even if the power supply is shut down, the non-volatile device 30 still maintains a programmed state. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 8 and 12 volt.

Figure 7A:
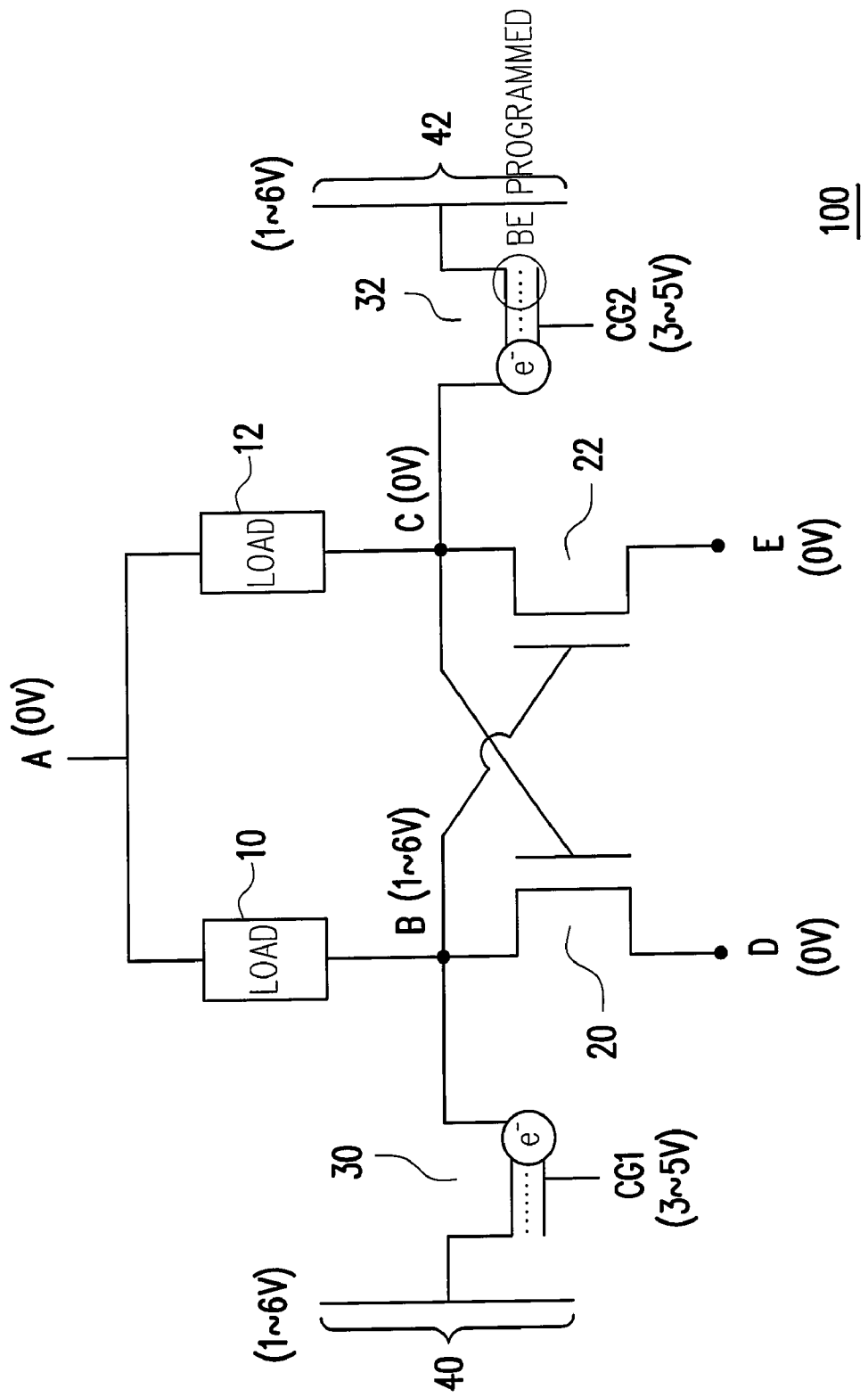
FIG. 7A is a schematic circuit diagram when the data of Logic 1 is recalled from a non-volatile device according to a first embodiment of the present invention.

FIG. 7A is a schematic circuit diagram when the data of Logic 1 is recalled from a non-volatile device according to a first embodiment of the present invention. Referring to FIG. 7A, it is assumed that the non-volatile device 32 is programmed initially. First, a voltage signal at a logic high level, for example, between 1-6 V, is provided to the bit lines 40, 42. Meanwhile, a voltage signal at a logic low level, for example, 0 V, is provided to the end points A, D, and E. Further, a control bias at a level, for example, between 3-5 V, is provided to the end points CG1 and CG2.

In view of the above, as not being programmed, the non-volatile device 30 is in the ON state. That is, the logic high level of the bit line 40 be saved in the end point B to assume a logic high level. In another aspect, as being programmed, the non-volatile device 32 is in an open state. Moreover, the logic high level of the end point B may conduct the MOS transistor 22. In other words, the end point C will be at a logic low level. As such, the logic state (Logic 1) of the data stored in the memory unit 100 is recalled from the non-volatile device 32.

Figure 7B:
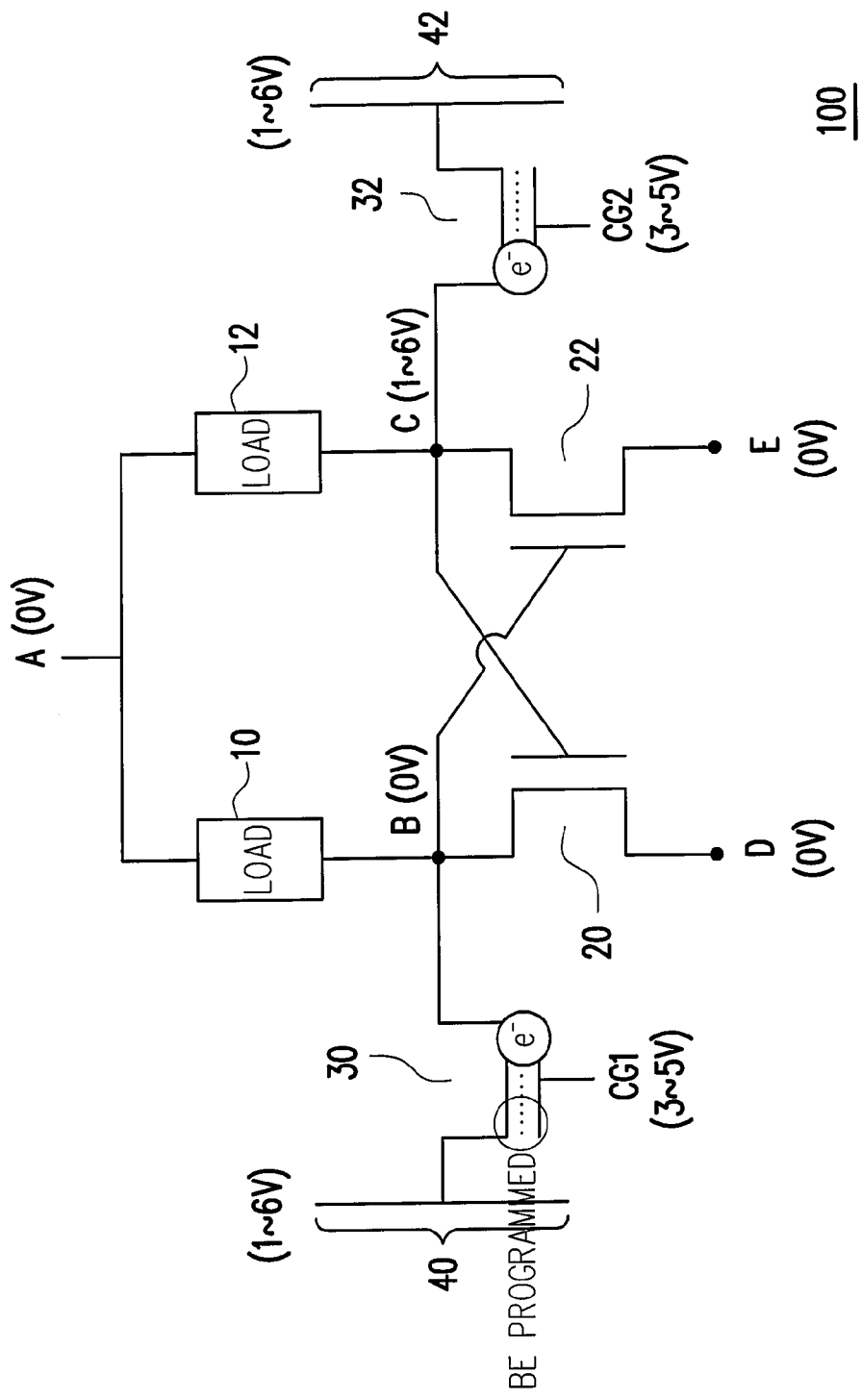
FIG. 7B is a schematic circuit diagram when the data of Logic 0 is recalled from a non-volatile device according to a first embodiment of the present invention.

FIG. 7B is a schematic circuit diagram when the data of Logic 0 is recalled from a non-volatile device according to a first embodiment of the present invention. Referring to FIG. 7B, it is assumed that the non-volatile device 30 is programmed initially. First, a voltage signal at a logic high level, for example, between 1-6 V, is provided to the bit lines 40, 42. Meanwhile, a voltage signal at a logic low level, for example, 0 V, is provided to the end points A, D, and E. Further, a control bias at a level, for example, between 3-5 V, is provided to the end points CG1 and CG2.

In view of the above, as not being programmed, the non-volatile device 32 is in the ON state. That is, the logic high level of the bit line 42 be saved in the end point C to assume a logic high level. In another aspect, as being programmed, the non-volatile device 30 is in an open state. Moreover, the logic high level of the end point C may conduct the MOS transistor 20. In other words, the end point B will be at a logic low level. As such, the logic state (Logic 0) of the data stored in the memory unit 100 is recalled from the non-volatile device 30.

Figure 8:
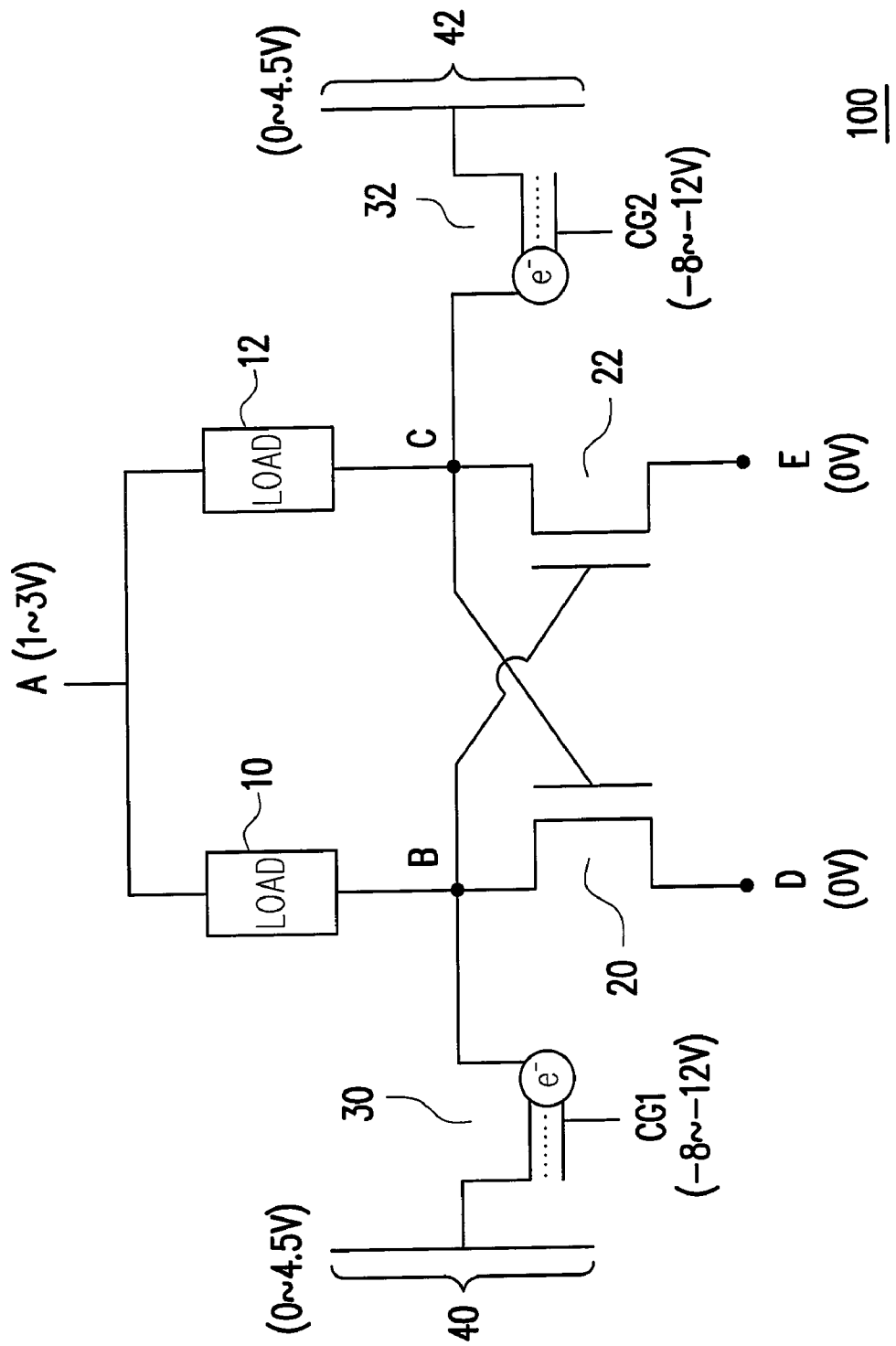
FIG. 8 is a schematic circuit diagram of easing a programmed state of a non-volatile device according to a first embodiment of the present invention.

FIG. 8 is a schematic circuit diagram of erasing a programmed state of a non-volatile device according to a first embodiment of the present invention. Referring to FIG. 8, it is assumed that the non-volatile device 30 or 32 is programmed initially. First, a voltage at a level, for example, between 0-4.5 V, is provided to the bit lines 40, 42. A voltage at a level, for example, between 1-3 V, is provided to the end point A, so as to maintain the logic state of the end points B, C. Meanwhile, a voltage signal at a logic low level, for example, 0 V, is provided to the end points D and E. Further, a control bias at a level, for example, between −8 and −12 V, is provided to the end points CG1 and CG2. Thus, the control gates of the non-volatile devices 30 and 32 are forced to release the charges. As such, the non-volatile device 30 or 32 can be programmed repeatedly. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between −10 and −20 volt.

Figure 9:
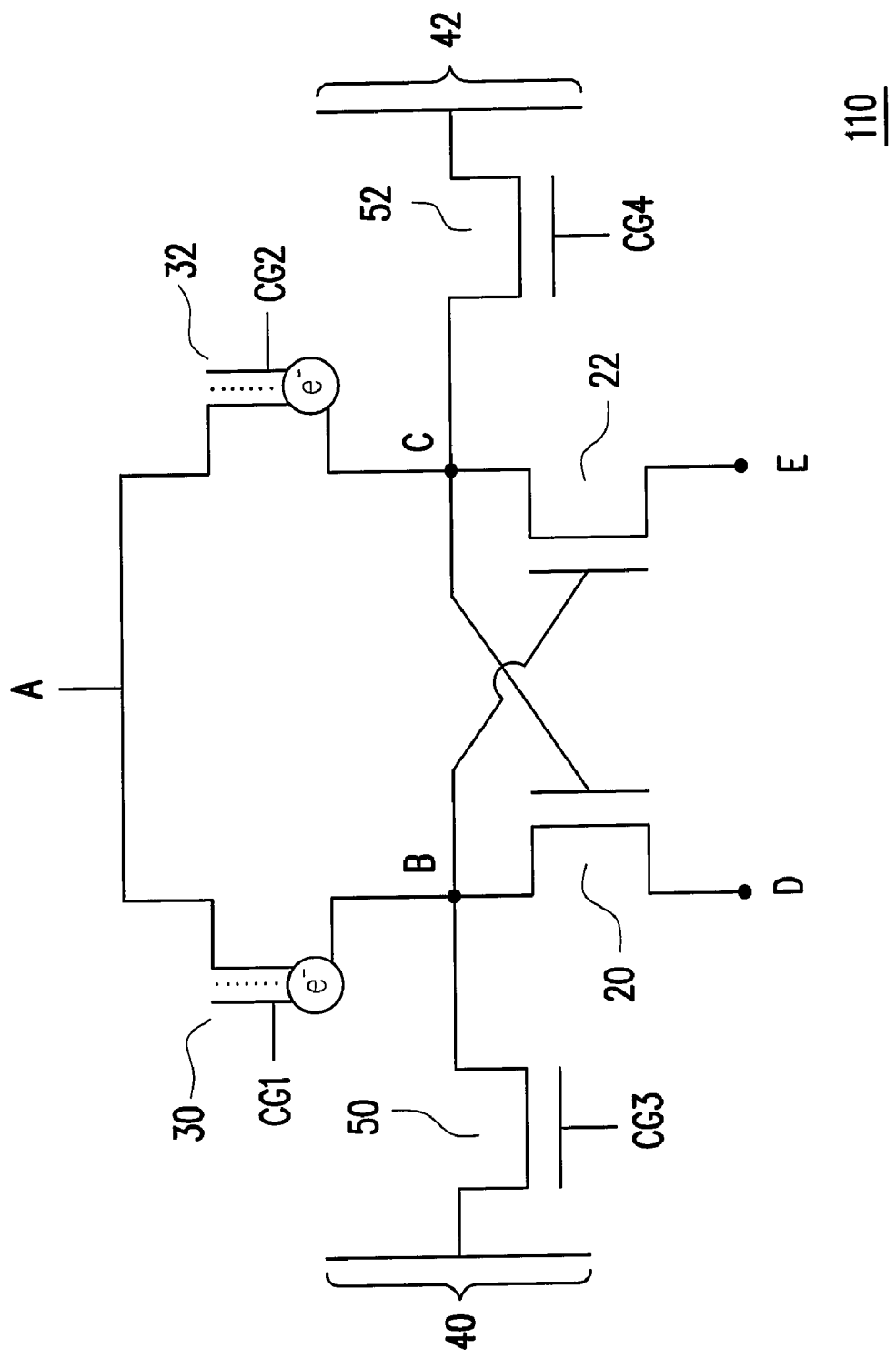
FIG. 9 is an equivalent circuit diagram of a memory unit according to a second embodiment of the present invention.

FIG. 9 is an equivalent circuit diagram of a memory unit according to a second embodiment of the present invention. The memory unit 110 includes the non-volatile devices 30, 32, and the MOS transistors 20, 22, 50, 52. A first end of the non-volatile device 30 is coupled to the end point A, and the end point A provides a first voltage. A second end of the non-volatile device 30 is coupled to the end point B, and the control gate is coupled to the end point CG1. A first end of the non-volatile device 32 is coupled to an end point A, a second end is coupled to the end point C, and the control gate is coupled to the end point CG2. In this embodiment, the structural cross-sectional views of the non-volatile devices 30, 32 are the same as those of the above embodiment, and the details will not be described herein again.

The first end of the MOS transistor 20 is coupled to the end point B, the second end is coupled to the end point D, and the gate is coupled to the end point C. The first end of the MOS transistor 22 is coupled to the end point C, the second end is coupled to the end point E, and the gate is coupled to the end point B. A control gate of the MOS transistor 50 is coupled to an end point CG3, a first end is coupled to the end point B, and a second end is coupled to the bit line 40. A control gate of the MOS transistor 52 is coupled to an end point CG4, a first end is coupled to the end point C, and a second end is coupled to the bit line 42. The MOS transistors 20, 22, 50, and 52 are, for example, NMOS transistors.

In this embodiment, the following description is given on the conditions of the non-volatile device 30 and 32 of the memory unit 100 with charge storage structure. It is assumed that when the end point B of the memory unit 110 is at a logic high level and the end point C is at a logic low level, the data stored in the memory unit 110 is of Logic 1. On the contrary, when the end point B of the memory unit 110 is at a logic low level and the end point C is at a logic low level, the data stored in the memory unit 110 is of Logic 0.

Figure 10A:
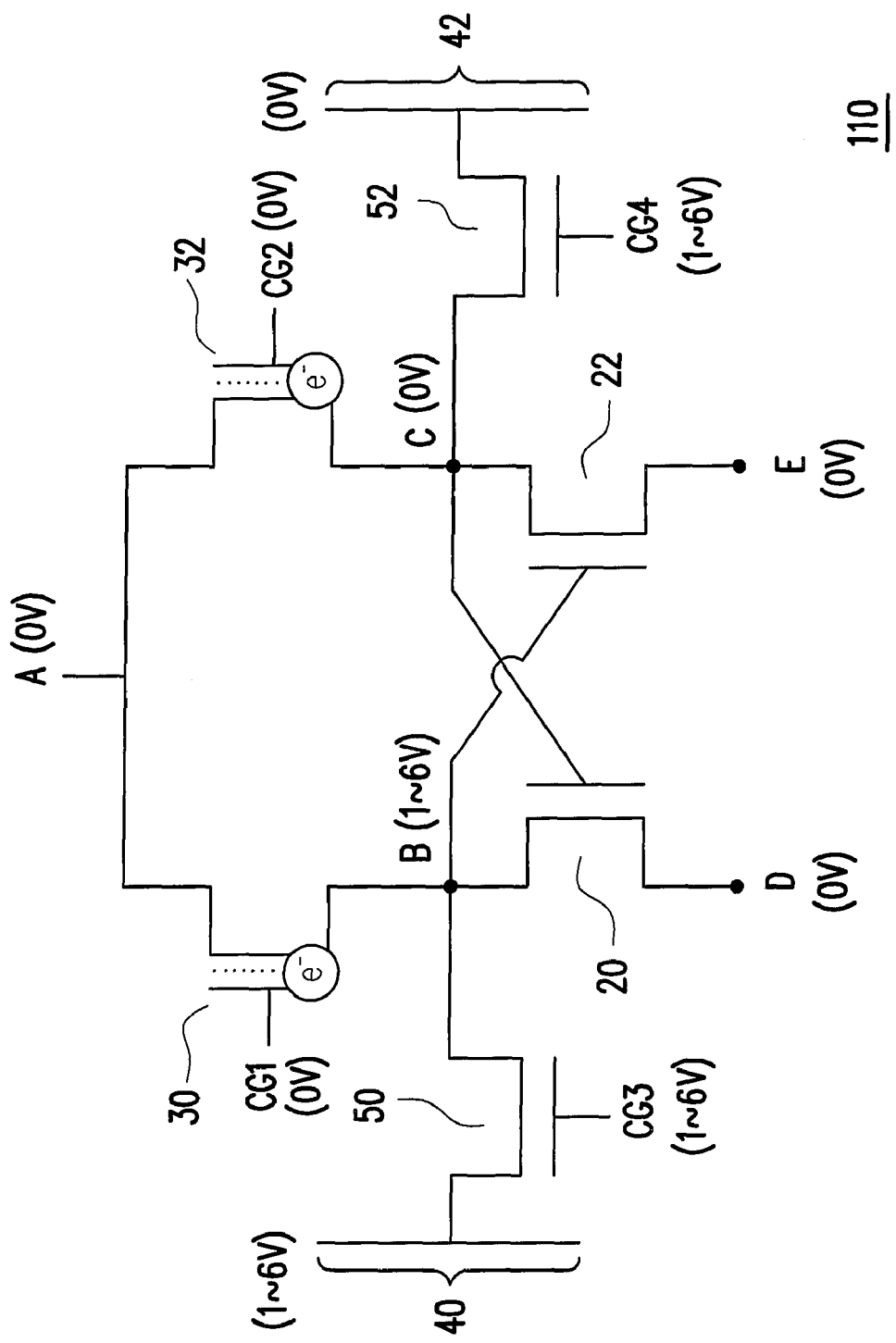
FIG. 10A is a schematic circuit diagram of a memory unit when the data of Logic 1 is programmed in according to a second embodiment of the present invention.

FIG. 10A is a schematic circuit diagram of a memory unit when the data of Logic 1 is programmed in according to a second embodiment of the present invention. Referring to FIG. 10A, it is assumed that the data of Logic 1 is to be programmed into the memory unit 110. First, a voltage signal at a logic high level, for example, between 1-6 V, is provided to the bit line 40. Meanwhile, a voltage signal at a logic low level, for example, 0 V, is provided to the end points A, D, E, CG1, CG2 and the bit line 42. Further, a control bias at a level, for example, between 1-6 V, is provided to the end points CG3 and CG4. Thus, the MOS transistors 50 and 52 are in the ON state. As such, the logic high level of the bit line 40 is stored in the end point B, and the logic low level of the bit line 42 is stored in the end point C.

Figure 10B:
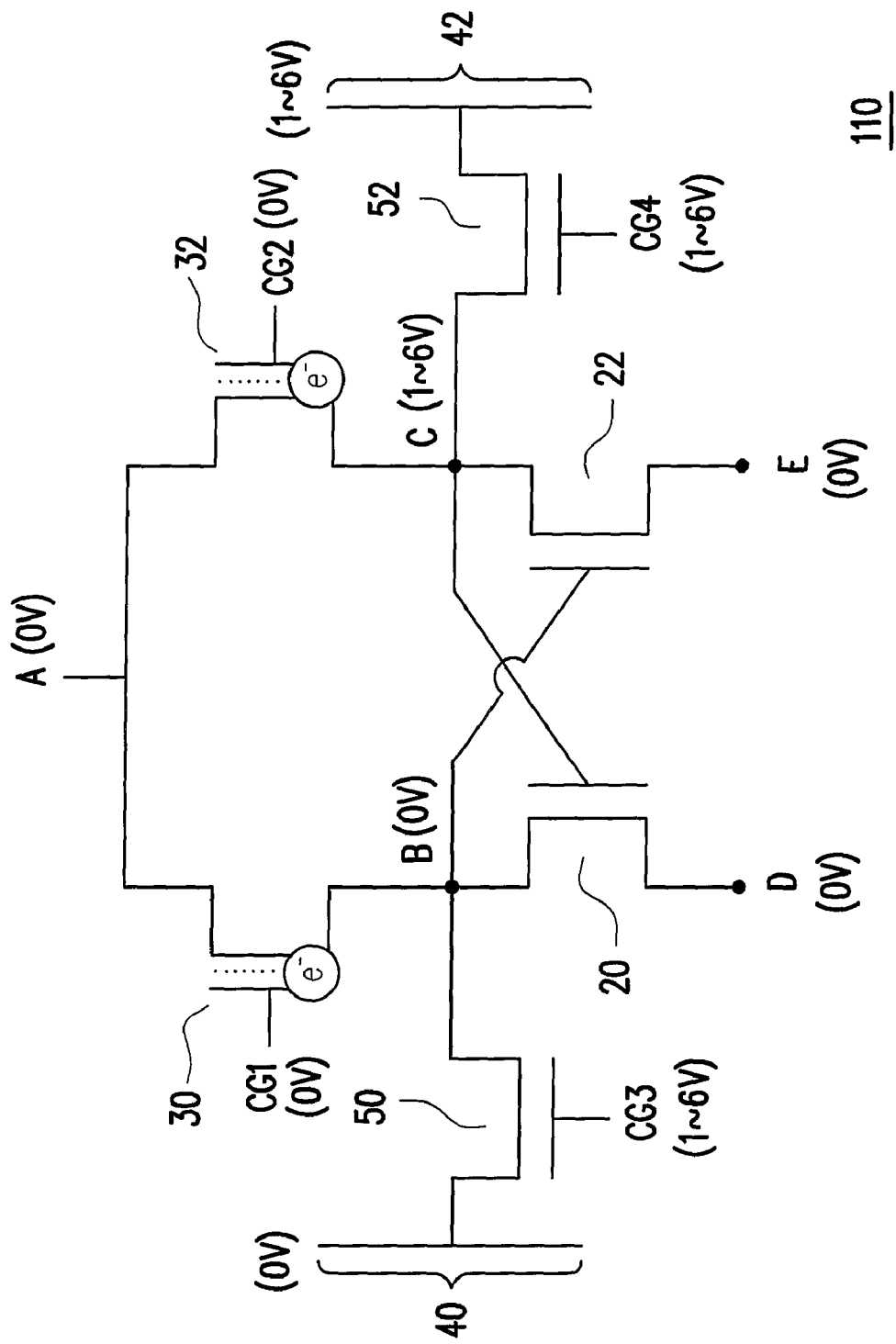
FIG. 10B is a schematic circuit diagram of a memory unit when the data of Logic 0 is programmed in according to a second embodiment of the present invention.

FIG. 10B is a schematic circuit diagram of a memory unit when the data of Logic 0 is programmed in according to a second embodiment of the present invention. Referring to FIG. 10B, it is assumed that the data of Logic 0 is to be programmed into the memory unit 110. First, a voltage signal at a logic high level, for example, between 1-6 V, is provided to the bit line 42. Meanwhile, a voltage signal at a logic low level, for example, 0 V, is provided to the end points A, D, E, CG1, CG2 and the bit line 40. Further, a control bias at a level, for example, between 1-6 V, is provided to the end points CG3 and CG4. Thus, the MOS transistors 50 and 52 are in the ON state. As such, the logic high level of the bit line 42 is stored in the end point C, and the logic low level of the bit line 40 is stored in the end point B.

Figure 11:
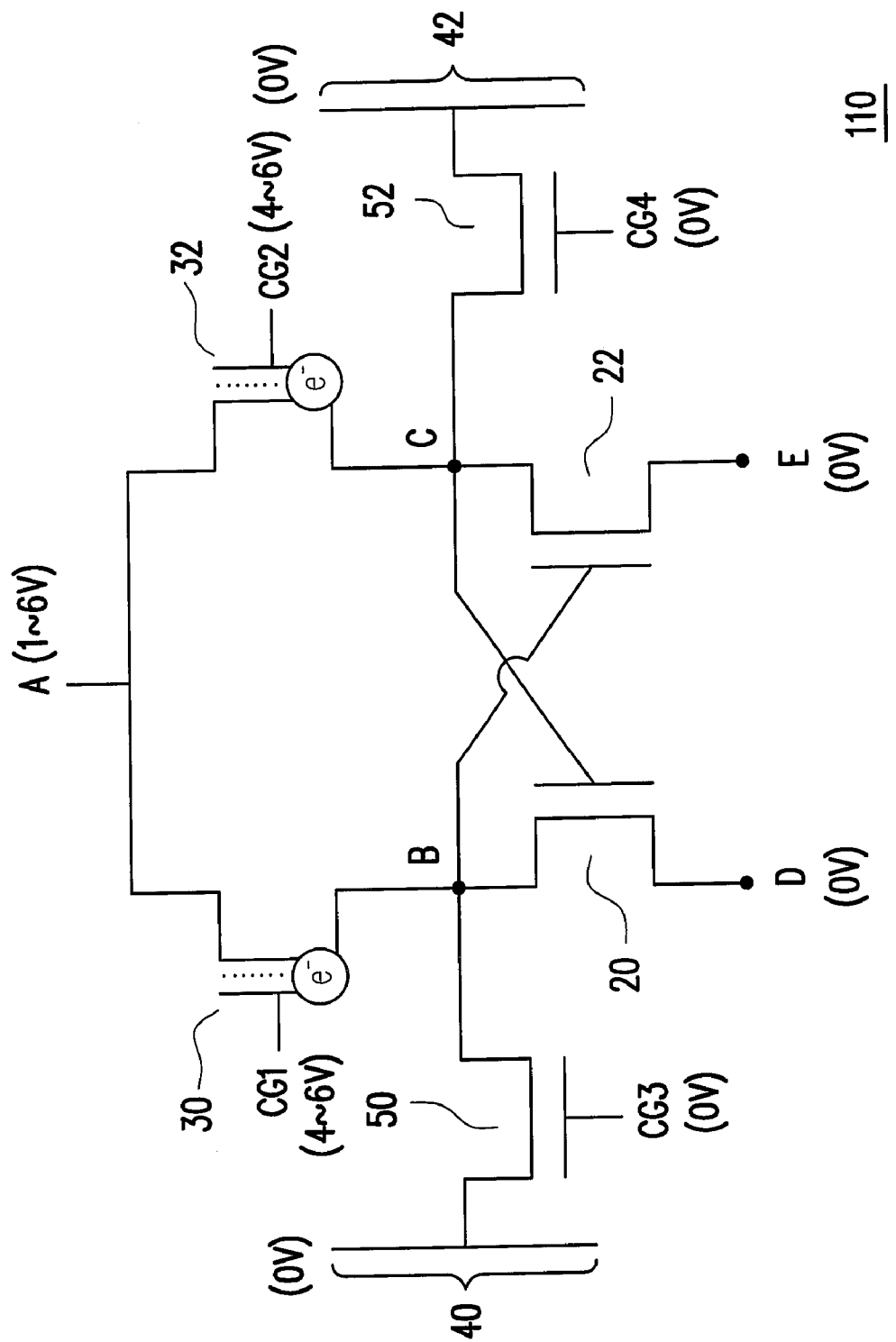
FIG. 11 is a schematic circuit diagram of a memory unit in a maintain state according to a second embodiment of the present invention.

FIG. 11 is a schematic circuit diagram of a memory unit in a maintain state according to a second embodiment of the present invention. Referring to FIG. 11, it is assumed that the data of the memory unit 110 will keep a maintain state. First, a voltage signal at a logic high level, for example, between 1-6 V, is provided to the end point A. Meanwhile, a voltage signal at a logic low level, for example, 0 V, is provided to the end points D, E, and the bit lines 40, 42. Further, a voltage signal at a logic low level, for example, 0 V, is provided to the end points CG3 and CG4. Whereby, the MOS transistors 50 and 52 are in an open state. Further, a control bias at a level, for example, between 4-6 V, is provided to the end points CG1 and CG2. Thus, the non-volatile devices 30 and 32 are in the ON state. As such, the logic level of the end points B and C is in a maintain state. In other words, the data stored in the memory unit 110 can maintain the original logic state. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 5 and 8 volt.

Figure 12A:
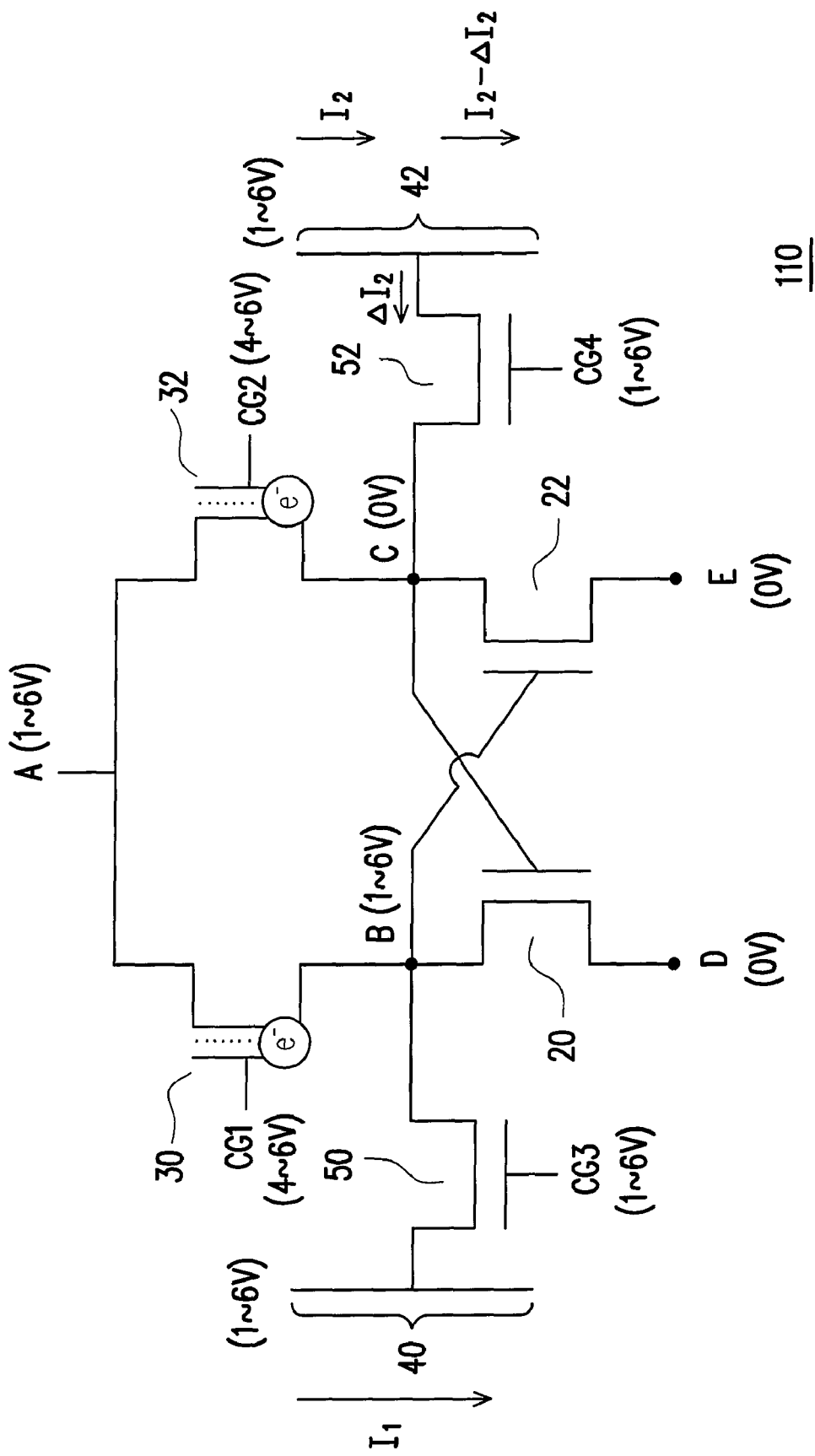
FIG. 12A is a schematic circuit diagram when the data of Logic 1 stored in a memory unit is read according to a second embodiment of the present invention.

FIG. 12A is a schematic circuit diagram when the data of Logic 1 stored in a memory unit is read according to a second embodiment of the present invention. Referring to FIG. 12A, it is assumed that the logic state stored in the memory unit 110 is Logic 1. First, a voltage signal at a logic high level, for example, between 1-6 V, is provided to the end point A, the first end of the bit line 40, and the first end of the bit line 42. Meanwhile, a voltage signal at a logic low level, for example, 0 V, is provided to the end points D and E. Further, a control bias at a level, for example, between 4-6 V, is provided to the end points CG1 and CG2. Thus, the non-volatile devices 30 and 32 are in the ON state. Further, a control bias at a level, for example, between 1-6 V, is provided to the end points CG3 and CG4. Whereby, the MOS transistors 50 and 52 are in the ON state.

In view of the above, though the MOS transistor 50 is in the ON state, as the end point B and the bit line 40 are at the same level, it can be regarded as that no current passes through the MOS transistor 50. That is, if the first end of the bit line 40 provides a current I1, the second end of the bit line 40 will receive the current I1. In another aspect, the end point C is at a level lower than the bit line 42. Thus, if the first end of the bit line 42 provides a current I2, a part of the current ΔI2 will flow from the bit line 42 and sequentially pass through the MOS transistor 52, the end point C, the MOS transistor 22 and then to the end point E. Besides, the second end of the bit line 42 will receive the current I2-ΔI2.

Those of ordinary skill in the art can use a sense amplifier of the memory unit 110 (not shown) to sense the difference of the output current amount between the second end of the bit line 40 and the second end of the bit line 42, the logic state of the data stored in the memory unit 110 can be read. For example, the output current amount of the second end of the bit line 40 is larger than that of the second end of the bit line 42, which indicates that the logic state stored in the memory unit 110 is Logic 1. Oppositely, the output current amount of the second end of the bit line 40 is smaller than that of the second end of the bit line 42, which indicates that the logic state of the data stored in the memory unit 100 is Logic 0.

Figure 12B:
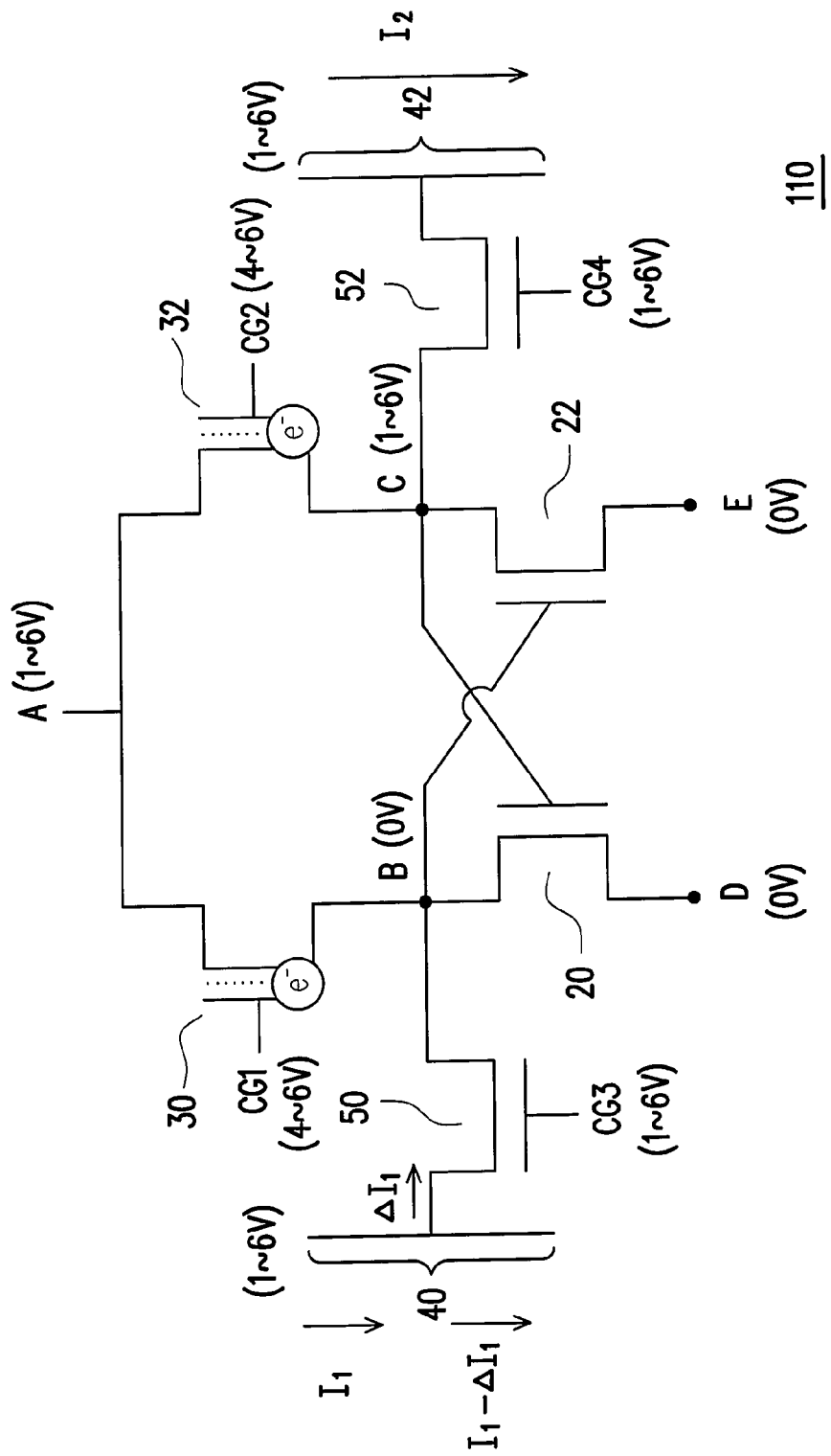
FIG. 12B is a schematic circuit diagram when the data of Logic 0 stored in a memory unit is read according to a second embodiment of the present invention.

FIG. 12B is a schematic circuit diagram when the data of Logic 0 stored in a memory unit is read according to a second embodiment of the present invention. Referring to FIG. 12B, it is assumed that the logic state stored in the memory unit 110 is Logic 0. First, a voltage signal at a logic high level, for example, between 1-6 V, is provided to the end point A, the first end of the bit line 40, and the first end of the bit line 42. Meanwhile, a voltage signal at a logic low level, for example, 0 V, is provided to the end points D and E. Further, a control bias at a level, for example, between 4-6 V, is provided to the end points CG1 and CG2. Thus, the non-volatile devices 30 and 32 are in the ON state. Further, a control bias at a level, for example, between 1-6 V, is provided to the end points CG3 and CG4. Whereby, the MOS transistors 50 and 52 are in the ON state. Other principles of reading can refer to the illustration of FIG. 12A, and the details will not be repeated herein again. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 5 and 8 volt.

Figure 13A:
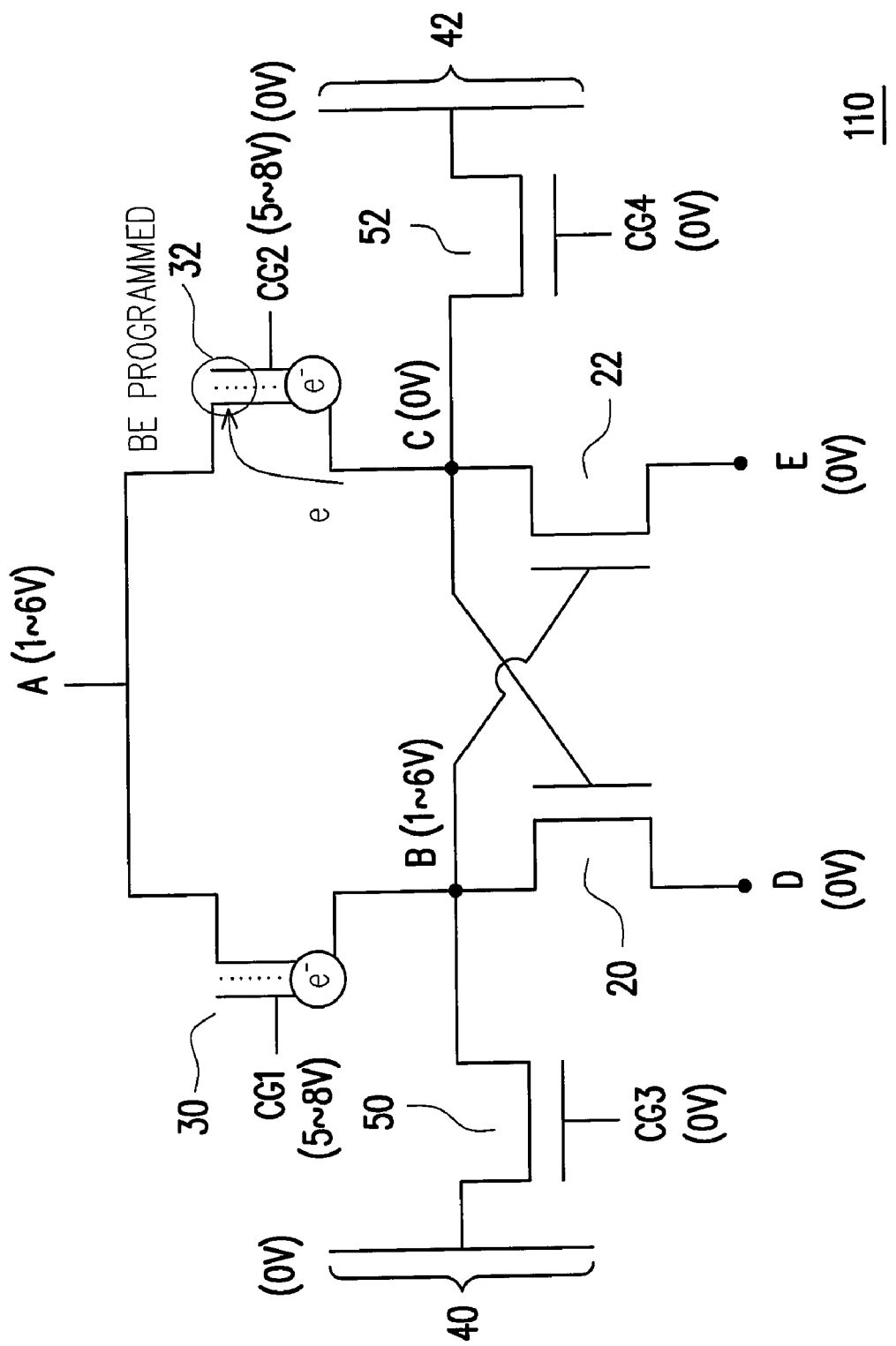
FIG. 13A is a schematic circuit diagram when the data of Logic 1 of a memory unit is written into a non-volatile device according to a second embodiment of the present invention.

FIG. 13A is a schematic circuit diagram of writing the data of Logic 1 of a memory unit into a non-volatile device according to a second embodiment of the present invention. Referring to FIG. 13A, it is assumed that the logic state stored in the memory unit 110 is Logic 1. First, a voltage signal at a logic high level, for example, between 1-6 V, is provided to the end point A. Meanwhile, a voltage signal at a logic low level, for example, 0 V, is provided to the end points D, E, and the bit lines 40, 42. A control bias at a level, for example, 0 V, is provided to the end points CG3 and CG4. Whereby, the MOS transistors 50 and 52 are in an open state. Further, a control bias at a level, for example, between 5-8 V, is provided to the end points CG1 and CG2. As the end points C and A have a certain voltage difference, a charge may be injected from the end point C into the charge storage layer of the non-volatile device 32, i.e., the non-volatile device 32 is programmed. The voltage difference between the end points B and A is insufficient to have the non-volatile device 30 programmed.

It should be noted that a plurality of charges is stored on the first side of the charge storage layer to accelerate the speed for programming another side of the charge storage layer. Thus, during the programming of the non-volatile device 32, the second side of the charge storage layer is programmed. As such, the logic state of Logic 1 of the memory unit 110 is stored in the non-volatile device 32. In other words, even if the power supply is shut down, the non-volatile device 32 still maintains a programmed state.

Figure 13B:
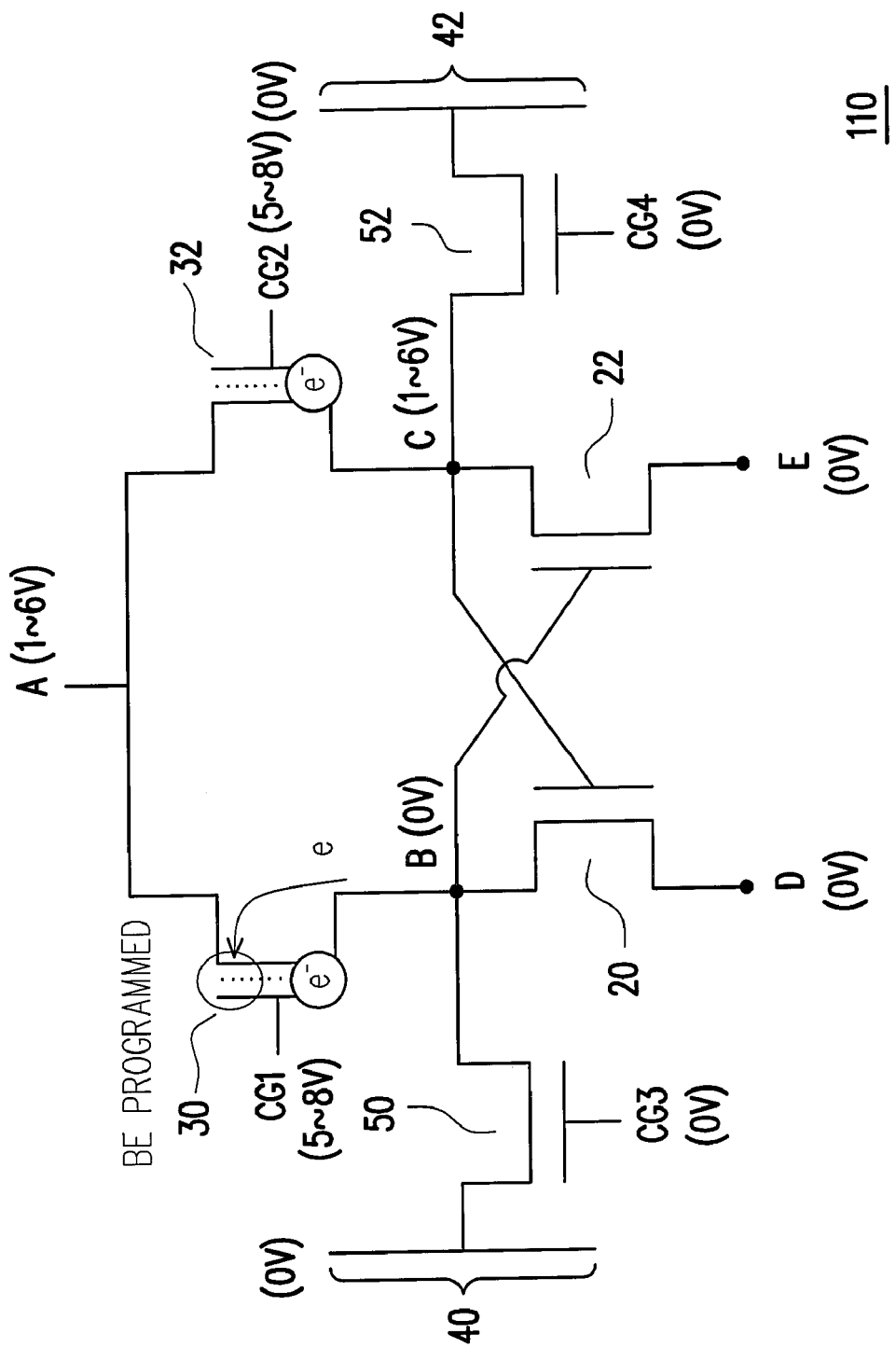
FIG. 13B is a schematic circuit diagram when the data of Logic 0 of a memory unit is written into a non-volatile device according to a second embodiment of the present invention.

FIG. 13B is a schematic circuit diagram when the data of Logic 0 of a memory unit is written into a non-volatile device according to a second embodiment of the present invention. Referring to FIG. 13B, it is assumed that the logic state stored in the memory unit 110 is Logic 0. First, a voltage signal at a logic high level, for example, between 1-6 V, is provided to the end point A. Meanwhile, a voltage signal at a logic low level, for example, 0 V, is provided to the end points D, E, and the bit lines 40, 42. A control bias at a level, for example, 0 V, is provided to the end points CG3 and CG4. Whereby, the MOS transistors 50 and 52 are in an open state. Further, a control bias at a level, for example, between 5-8 V, is provided to the end points CG1 and CG2. As the end points B and A have a certain voltage difference, an charge may be injected from the end point B into the charge storage layer of the non-volatile device 30, i.e., the non-volatile device 30 is programmed. The voltage difference between the end points C and A is insufficient to have the non-volatile device 32 programmed.

It should be noted that, a plurality of charges is stored on the first side of the charge storage layer to accelerate the speed for programming another side of the charge storage layer. Thus, during the programming of the non-volatile device 30, the second side of the charge storage layer is programmed. As such, the logic state of Logic 0 of the memory unit 110 is stored in the non-volatile device 30. In other words, even if the power supply is shut down, the non-volatile device 30 still maintains a programmed state. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between 8 and 12 volt.

Figure 14A:
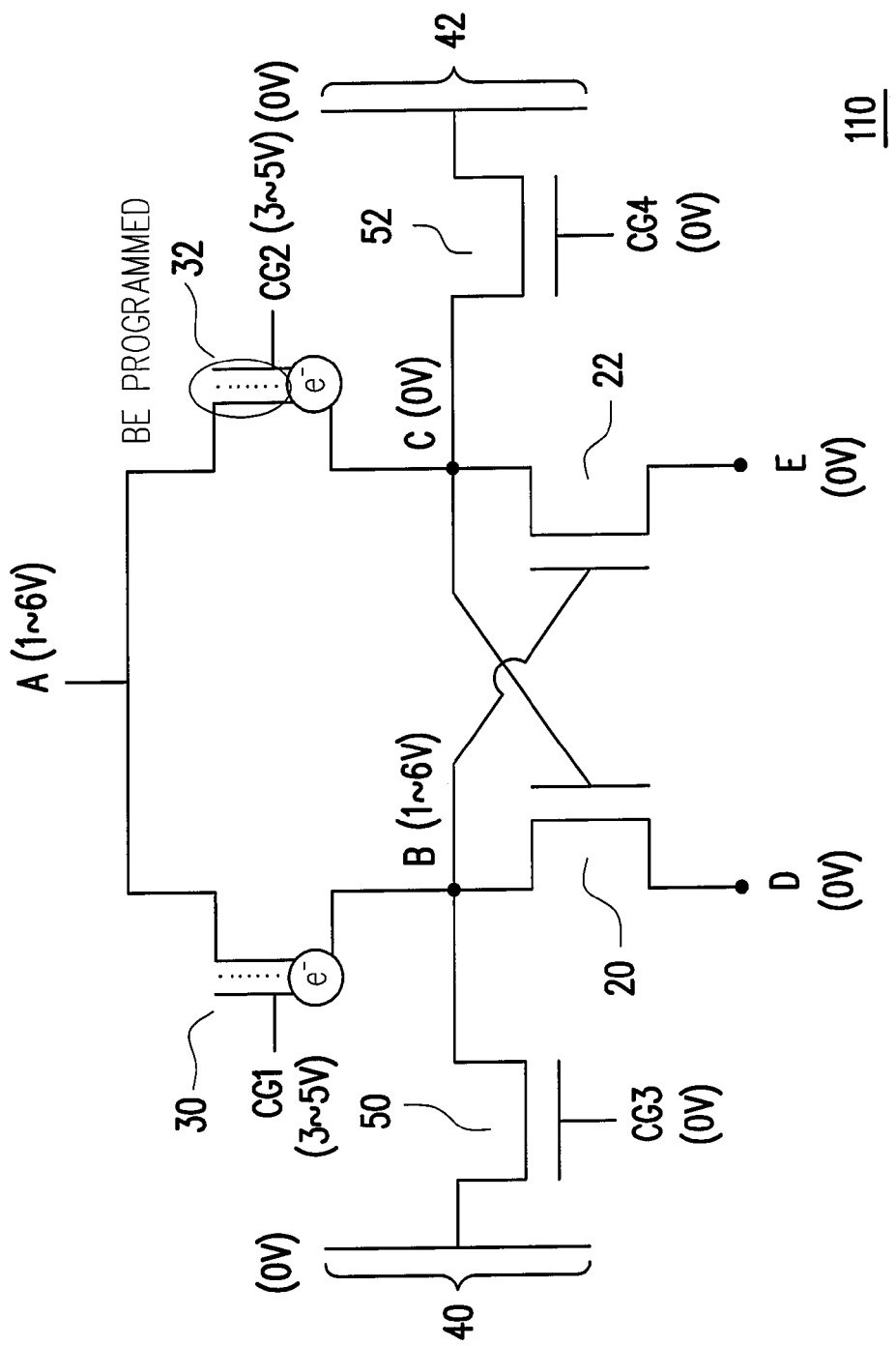
FIG. 14A is a schematic circuit diagram when the data of Logic 1 is recalled from a non-volatile device according to a second embodiment of the present invention.

FIG. 14A is a schematic circuit diagram when the data of Logic 1 is recalled from a non-volatile device according to a second embodiment of the present invention. Referring to FIG. 14A, it is assumed that the non-volatile device 32 is programmed initially. First, a voltage signal at a logic high level, for example, between 1-6 V, is provided to the end point A. Meanwhile, a voltage signal at a logic low level, for example, 0 V, is provided to the bit lines 40, 42, and the end points D, E. A control bias at a level, for example, 0 V, is provided to the end points CG3 and CG4. Whereby, the MOS transistors 50 and 52 are in an open state. Further, a control bias at a level, for example, between 3-5 V, is provided to the end points CG1 and CG2.

In view of the above, as not being programmed, the non-volatile device 30 is in the ON state. So that, the end point B is transferred to a logic high level. In another aspect, as being programmed, the non-volatile device 32 is in an open state. Moreover, the logic high level of the end point B may conduct the MOS transistor 22. In other words, the end point C will be at a logic low level. As such, the Logic 1 of the memory unit 110 is recalled from the non-volatile device 32.

Figure 14B:
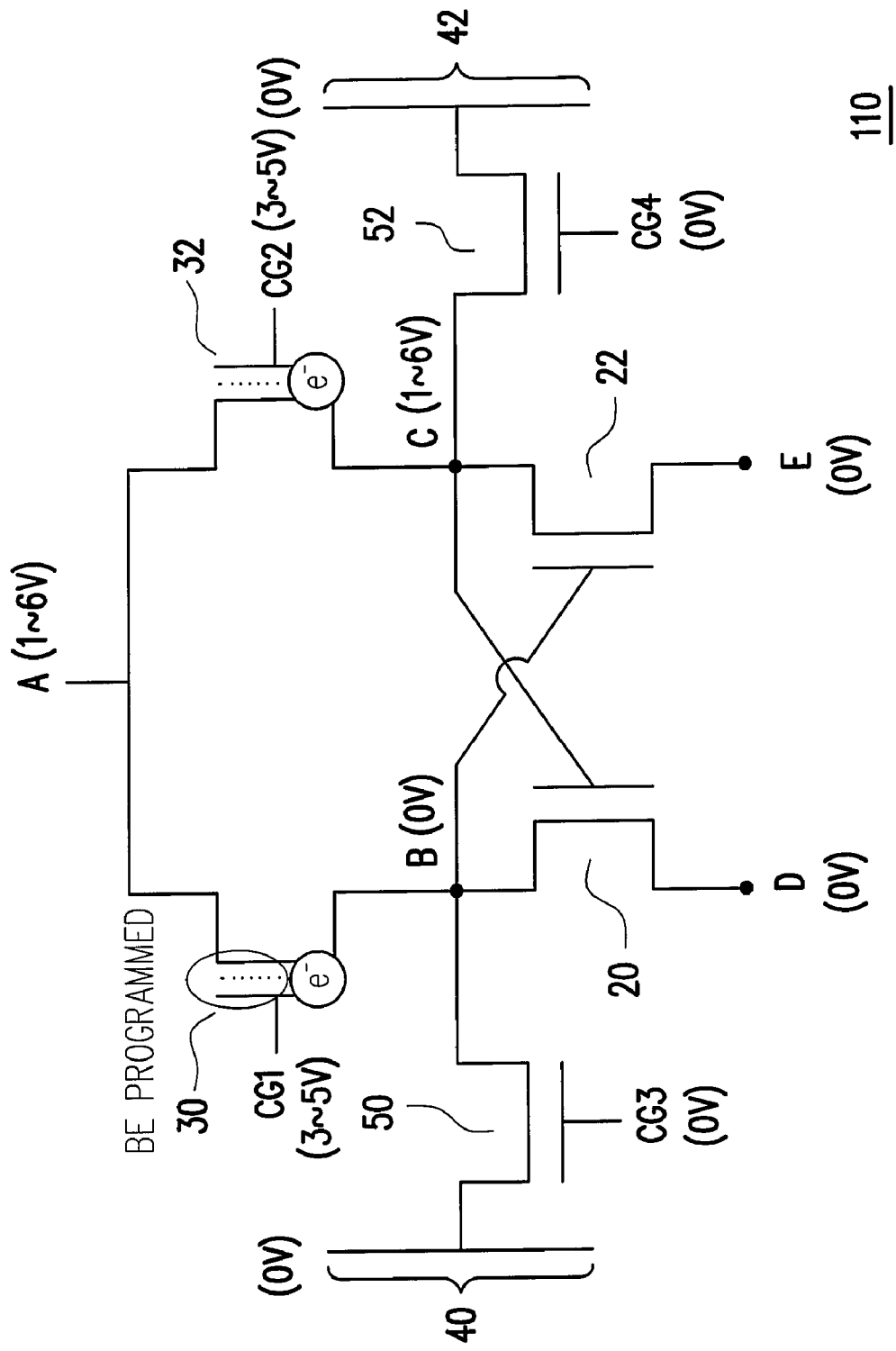
FIG. 14B is a schematic circuit diagram when the data of Logic 0 is recalled from a non-volatile device according to a second embodiment of the present invention.

FIG. 14B is a schematic circuit diagram when the data of Logic 0 is recalled from a non-volatile device according to a second embodiment of the present invention. Referring to FIG. 14B, it is assumed that the non-volatile device 30 is programmed initially. First, a voltage signal at a logic high level, for example, between 1-6 V, is provided to the end point A. Meanwhile, a voltage signal at a logic low level, for example, 0 V, is provided to the bit lines 40, 42, and the end points D, E. A control bias at a level, for example, 0 V, is provided to the end points CG3 and CG4. Whereby, the MOS transistors 50 and 52 are in an open state. Further, a control bias at a level, for example, between 3-5 V, is provided to the end points CG1 and CG2.

In view of the above, as not being programmed, the non-volatile device 32 is in the ON state. So that, the end point C goes to a logic high level. In another aspect, as being programmed, the non-volatile device 30 is in an open state. Moreover, the logic high level of the end point C may conduct the MOS transistor 20. In other words, the end point B will be at a logic low level. As such, the Logic 0 of the memory unit 110 is recalled from the non-volatile device 30.

Figure 15:
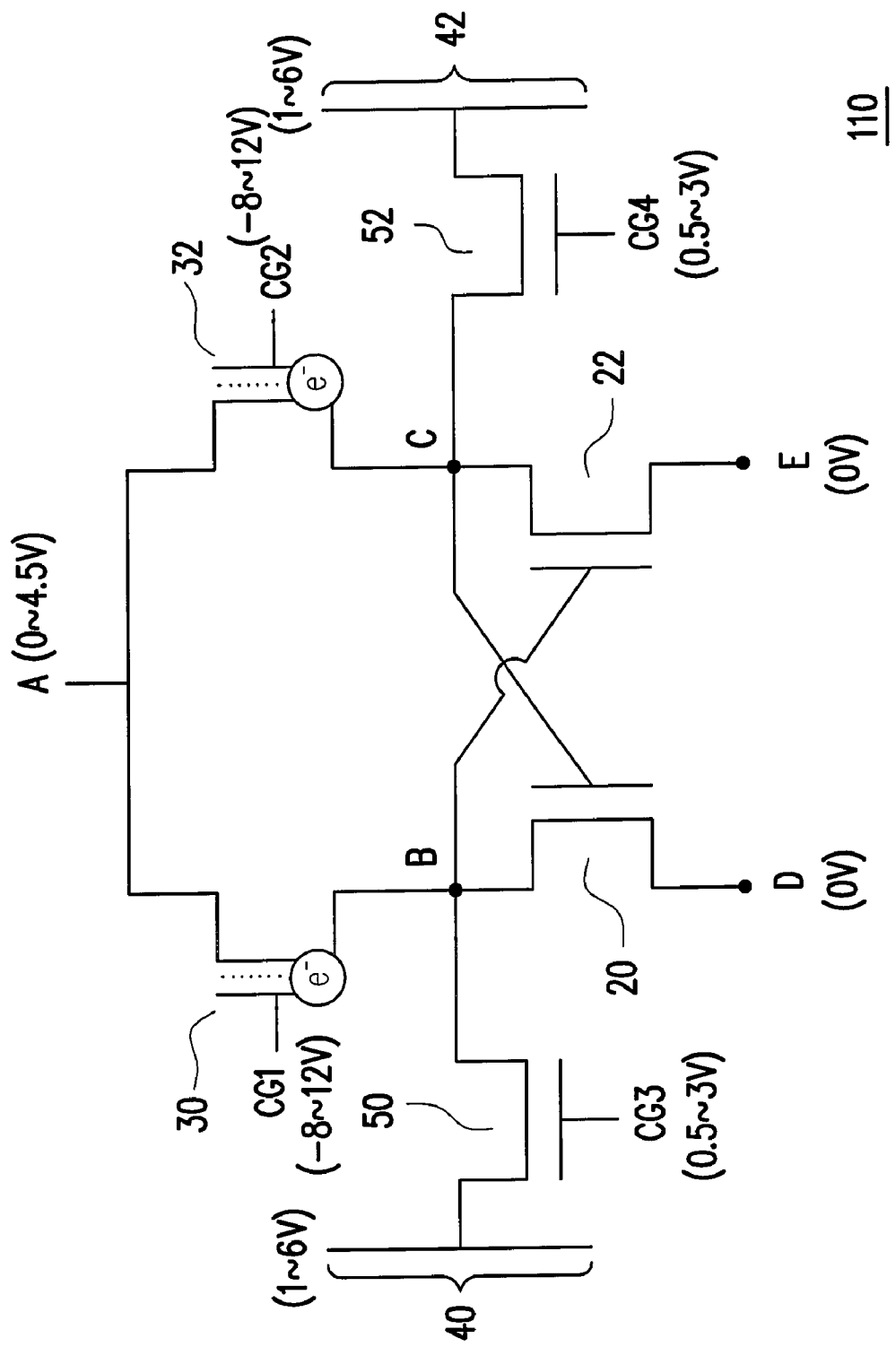
FIG. 15 is a schematic circuit diagram of erasing a programmed state of a non-volatile device according to a second embodiment of the present invention.

FIG. 15 is a schematic circuit diagram of erasing a programmed state of a non-volatile device according to a second embodiment of the present invention. Referring to FIG. 15, it is assumed that the non-volatile device 30 or 32 is programmed initially. First, a voltage signal at a logic high level, for example, between 1-6 V, is provided to the bit lines 40, 42. Further, a voltage at a level, for example, between 0-4.5 V, is provided to the end point A. A voltage signal at a logic low level, for example, 0 V, is provided to the end points D and E. A control bias at a level, for example, between 0.5-3 V, is provided to the end points CG3 and CG4, so as to maintain the logic state of the end points B, C. Further, a control bias at a level, for example, between −8 and −12 V, is provided to the end points CG1 and CG2. Thus, the control gates of the non-volatile devices 30 and 32 are forced to release charges. As such, the non-volatile device 30 or 32 can be programmed repeatedly. In other embodiments, the people skilled in the art can vary the structure of the non-volatile devices, and give another operation voltage with different voltage range. For example, when the non-volatile devices have poly-split-gate structure, the voltage range of the control voltages provided to the connector CG1 and CG2 are between −10 and −20 volt.

In view of the above, the embodiments of the present invention at least have the following advantages.

1. As the memory unit adopts non-volatile devices of an AC-SONOS structure, the logic state of the memory unit can be stored in the non-volatile devices. Thus, even if the power supply is shut down, the data stored in the memory can still be kept. Moreover, after the power supply is turned on again, the data can be read from the non-volatile devices.

2. The present invention not only has an advantage of high speed operation of an SRAM, but also has a function for storing data of a non-volatile memory.

3. The non-volatile devices can replace transistors in a conventional memory unit, so the size of the memory unit may not be increased. Thus, the function of storing data into the non-volatile devices can be improved without increasing the size of the memory, which is beneficial for the integrity of element.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory unit, comprising:
    a first metal oxide semiconductor (MOS) transistor, having a first end coupled to a first contact which is coupled to a first voltage, a second end coupled to a second voltage, and a gate coupled to a second contact which is coupled to the first voltage;
    a second MOS transistor, having a first end coupled to the second contact, a second end coupled to a third voltage, and a gate coupled to the first contact;
    a first non-volatile device, having a control gate coupled to a first control bias, a first end of the first non-volatile device is coupled to the first contact, and a second end of the first non-volatile device is coupled to a first bit line; and
    a second non-volatile device, having a control gate coupled to a second control bias, a first end of the second non-volatile device is coupled to the second contact, and a second end of the second non-volatile device is coupled to a second bit line,
    wherein the first non-volatile device and the second non-volatile device respectively comprise:
        a substrate, having a source region and a drain region;
        a charge storage layer, disposed on the substrate, wherein a plurality of assist charges are fixed at only one non-data side of the charge storage layer to accelerate a speed for programming another side of the charge storage layer; and
        a control gate, disposed on the charge storage layer.

2. The memory unit as claimed in claim 1, wherein the material of the charge storage layer comprises a charge trapping material.

3. The memory unit as claimed in claim 2, wherein the charge trapping material comprises silicon nitride.

4. The memory unit as claimed in claim 1, wherein the first non-volatile device and second non-volatile device further comprises:
    a top dielectric layer, disposed between the control gate and the charge storage layer; and
    a bottom dielectric layer, disposed between the substrate and the charge storage layer.

5. The memory unit as claimed in claim 4, wherein the material of the top dielectric layer comprises silicon oxide.

6. The memory unit as claimed in claim 4, wherein the material of the bottom dielectric layer comprises silicon nitride.

7. The memory unit as claimed in claim 4, wherein the bottom dielectric layer is composed by a first oxide layer, a nitride layer, and a second oxide layer sequentially.

8. The memory unit as claimed in claim 7, wherein the material of the first oxide layer and the second oxide layer comprises silicon oxide.

9. The memory unit as claimed in claim 7, wherein the material of the nitride layer comprises silicon nitride.

10. The memory unit as claimed in claim 1, further comprises:
a first loading unit, coupled between the first contact and the first voltage; and
a second loading unit, coupled between the second contact and the first voltage.

11. The memory unit as claimed in claim 10, wherein the first load unit and the second load unit are depletion mode transistors, P-type metal oxide semiconductor (PMOS) transistors, thin film transistors (TFTs), or resistors.

12. The memory unit as claimed in claim 1, wherein the first and second MOS transistors are NMOS transistors.

13. The memory unit as claimed in claim 1, wherein when a state thereof is a programming state, a plurality of operation steps for programming comprise:
the first voltage and the logic level of the first bit line are logic low level;
the logic level of the second bit line, the first non-volatile device and the state of second non-volatile are conducted;
the logic level of the first bit line is saved at the first contact and the logic level of the second bit line is saved at the second contact.

14. The memory unit as claimed in claim 13, wherein the operation steps for programming further comprise:
the voltage range of higher logic level of the bit lines is between 1 and 6 volt;
the second voltage, the third voltage and the lower logic level between the bit lines is 0 volt; and
the voltage rage of the first control bias and the second control bias are between 4 and 8 volt.

15. The memory unit as claimed in claim 1, wherein when a state thereof is a maintaining state, a plurality of operation method for maintaining comprise:
the first voltage is logic high level;
the first non-volatile device and the state of second non-volatile are circuit opened; and
the logic states of the first contact and the second contact are the maintaining state.

16. The memory unit as claimed in claim 15, wherein the operation steps for maintaining further comprise:
the voltage range of the logic high level is between 1 and 6 volt; and
the second voltage, the third voltage, the first control bias, the second control bias, the voltage of the first bit line and the second bit line are 0 volt.

17. The memory unit as claimed in claim 1, further has a sense amplifier coupled to the second terminals of the first bit line and second bit line, and when the state of the memory unit is reading state, a plurality of operation steps for reading comprise:
the first voltage and the logic level of the first contact are logic high level;
the logic level of the second contact is logic low level; and
the first non-volatile device and the second non-volatile device are conducted,
wherein a logic high level is outputted from the first ends of the first bit line and the second bit line, so as to read the logic state of the memory unit by the sense amplifier sensing the difference of currents of the second ends of the first bit line and the second bit line.

18. The memory unit as claimed in claim 17, wherein the operation steps for reading further comprise:
the voltage range of logic high level is between 1 and 6 volt;
the second voltage, the third voltage, and the lower logic level between the first contact and the second contact are 0 volt; and
the voltage range of the first control bias and the second control bias is between 4 and 8 volt.

19. The memory unit as claimed in claim 1, wherein when a data is written into the memory unit, a plurality of operation steps for writing comprise:
the first voltage, the second contact, the first bit line and the second bit line are logic high level; and
the first contact is logic low level, so as to the first non-volatile device is programmed, and the second non-volatile device is not programmed.

20. The memory unit as claimed in claim 19, wherein the operation steps for writing further comprise:
the voltage range of logic high level is between 1 and 6 volt;
the second voltage, the third voltage, and the logic low level are 0 volt; and
the first and second control bias are between 5 and 12 volt.

21. The memory unit as claimed in claim 1, wherein a data is recalled from the memory unit, a plurality of operation steps for recalling comprise:
the first non-volatile device is circuit opened;
the second non-volatile device is conducted;
the first voltage and the logic level of the first contact are logic low level; and
the logic level of the first contact, the first bit line and the second bit line are logic high level.

22. The memory unit as claimed in claim 21, wherein the operation steps for recalling further comprise:
the voltage range of logic high level is between 1 and 6 volt;
the second voltage, the third voltage, and the logic low level are 0 volt; and
the first and second control bias are between 3 and 5 volt.

23. The memory unit as claimed in claim 1, wherein a data is erased from the memory unit, a plurality of operation steps for erasing comprise:
on the logic level of the first bit line is between 0 and 4.5 volt; and
the voltage range of the first control bias is between −20 and −8 volt, so as to remove the programmed state of the first non-volatile device.

24. The memory unit as claimed in claim 23, wherein the operation steps for erasing further comprise:
the voltage range of the first voltage is between 1 and 3 volt; and
the second voltage and the third voltage are 0 volt, so as to sustain the logic level of the first and second contacts.

* * * * *